(12) United States Patent
Negoro et al.

(10) Patent No.: US 12,334,366 B2
(45) Date of Patent: Jun. 17, 2025

(54) SUBSTRATE PROCESSING APPARATUS AND SUBSTRATE PROCESSING METHOD

(71) Applicant: SCREEN Holdings Co., Ltd., Kyoto (JP)

(72) Inventors: Sei Negoro, Kyoto (JP); Masayuki Orisaka, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 418 days.

(21) Appl. No.: 17/550,076

(22) Filed: Dec. 14, 2021

(65) Prior Publication Data
US 2022/0208563 A1 Jun. 30, 2022

(30) Foreign Application Priority Data
Dec. 28, 2020 (JP) .................. 2020-219432

(51) Int. Cl.
*H01L 21/67* (2006.01)
(52) U.S. Cl.
CPC .............................. *H01L 21/67023* (2013.01)
(58) Field of Classification Search
None
See application file for complete search history.

(56) References Cited

U.S. PATENT DOCUMENTS

| 2004/0040584 | A1 | 3/2004 | Miya et al. .................. 134/21 |
| 2010/0101497 | A1 | 4/2010 | Izuta et al. .................. 118/730 |
| 2013/0224956 | A1 | 8/2013 | Negoro et al. ............... 438/697 |
| 2016/0214148 | A1 | 7/2016 | Okutani et al. |
| 2017/0282210 | A1 | 10/2017 | Okutani et al. |
| 2018/0345315 | A1 | 12/2018 | Tanaka et al. |
| 2019/0172703 | A1* | 6/2019 | Okutani ............ H01L 21/68721 |
| 2020/0071848 | A1 | 3/2020 | Koukitu et al. |
| 2022/0208563 | A1* | 6/2022 | Negoro ............ H01L 21/68742 |

FOREIGN PATENT DOCUMENTS

| JP | 2004-146784 A | 5/2004 |
| JP | 2007-142077 A | 6/2007 |
| JP | 2010-238758 A | 10/2010 |
| JP | 2012-221596 A | 11/2012 |
| JP | 2013-197114 A | 9/2013 |
| JP | 2013-201334 A | 10/2013 |
| JP | 2017-183634 A | 10/2017 |
| TW | 201903199 A | 1/2019 |
| TW | I680016 B | 12/2019 |

* cited by examiner

*Primary Examiner* — Sylvia MacArthur
(74) *Attorney, Agent, or Firm* — OSTROLENK FABER LLP

(57) ABSTRACT

A substrate processing apparatus includes a spin chuck that holds a substrate, and a fluid nozzle disposed to face a principal surface of the substrate which is held by the spin chuck. The fluid nozzle includes a gas discharge port from which a gas is discharged radially from the center side of the principal surface of the substrate to the peripheral edge side, and a gas flow passage through which the gas is supplied to the gas discharge port, the gas flow passage having a tubular shape along an intersecting direction with respect to the principal surface of the substrate. The gas flow passage has a gas retaining portion whose flow passage cross-sectional area is larger than other portions of the gas flow passage, and a rectifying structure provided in a portion of the gas flow passage different from the gas retaining portion, the rectifying structure that rectifies a flow of the gas in the gas flow passage.

14 Claims, 22 Drawing Sheets

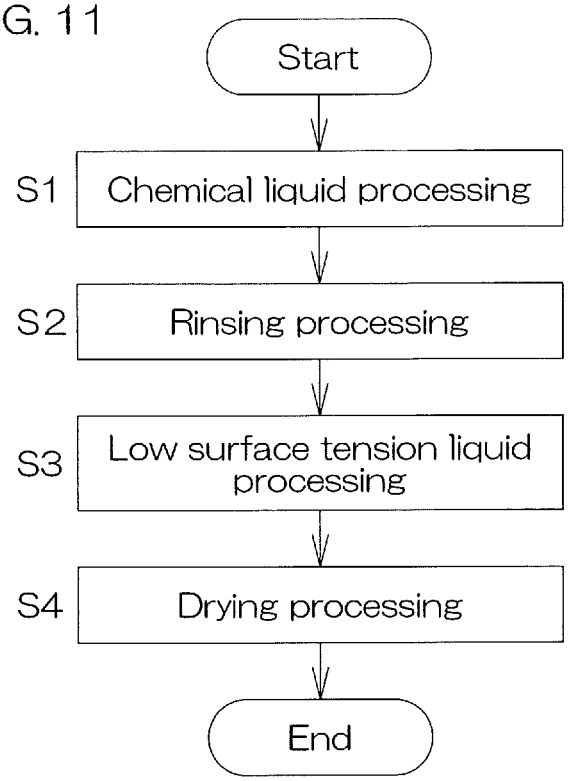

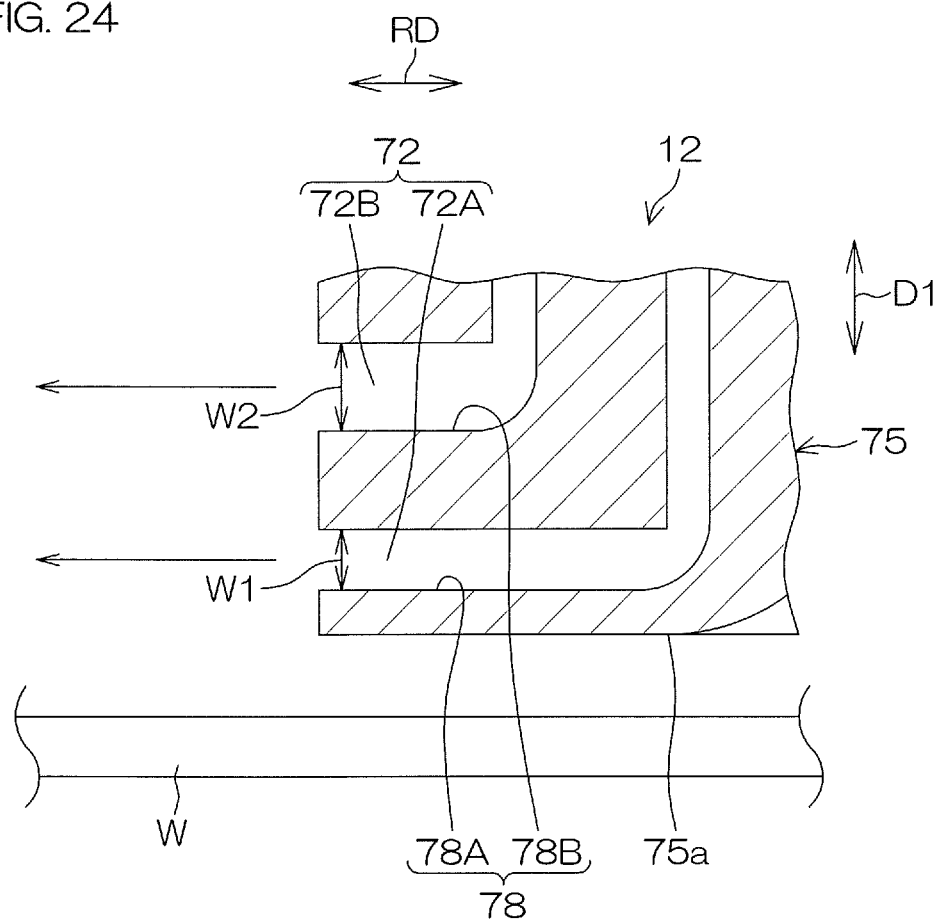

SUBSTRATE PROCESSING APPARATUS AND SUBSTRATE PROCESSING METHOD

CROSS REFERENCE TO RELATED APPLICATIONS

The present application corresponds to Japanese Patent Application No. 2020-219432 filed with the Japan Patent Office on Dec. 28, 2020, the entire disclosure of which is incorporated herein by reference.

BACKGROUND OF THE INVENTION

1. Field of the Invention

The present invention relates to a substrate processing apparatus that processes a substrate and a substrate processing method that processes a substrate. Examples of substrates to be processed include semiconductor wafers, substrates for FPDs (Flat Panel Displays) such as liquid crystal display devices and organic EL (Electroluminescence) display devices, substrates for optical disks, substrates for magnetic disks, substrates for magneto-optical disks, substrates for photomasks, ceramic substrates, and substrates for solar cells.

2. Description of the Related Art

United States Patent Application Publication No. 2016/0214148 discloses that an inert gas flow parallel to an upper surface of a substrate is formed from the center of the substrate toward a peripheral edge, and by covering the upper surface of the substrate by the inert gas flow, it is possible to suppress or prevent liquid droplets and mist from adhering to the upper surface of the substrate.

SUMMARY OF THE INVENTION

In order to efficiently suppress liquid droplets and mist of a processing liquid from adhering to the upper surface of the substrate, there is a need for enhancing uniformity of the spread of a gas which is discharged from a discharge port from the center side of the upper surface of the substrate to the peripheral edge side. Thus, an object of the present invention is to provide a substrate processing apparatus and a substrate processing method capable of improving uniformity of the spread of a gas in a configuration that the gas is discharged radially from a gas discharge port.

An aspect of the present disclosure is to provide a substrate processing apparatus including a spin chuck that holds a substrate, and a fluid nozzle disposed to face a principal surface of the substrate which is held by the spin chuck. The fluid nozzle includes a gas discharge port from which a gas is discharged radially from the center side of the principal surface of the substrate toward the peripheral edge side, and a gas flow passage through which the gas is supplied to the gas discharge port, the gas flow passage having a tubular shape along an intersecting direction with respect to the principal surface of the substrate. The gas flow passage has a gas retaining portion whose flow passage cross-sectional area is larger than other portions of the gas flow passage, and a rectifying structure provided in a portion of the gas flow passage different from the gas retaining portion, the rectifying structure that rectifies a flow of the gas in the gas flow passage.

With this configuration, since the gas retaining portion whose flow passage cross-sectional area is larger than other portions of the gas flow passage is provided in the gas flow passage, the gas supplied to the gas retaining portion is dispersed in the gas retaining portion. Therefore, flow speed of the gas supplied into the gas retaining portion is reduced, and a flow speed difference of the gas between the positions in the circumferential direction of the gas flow passage is reduced. Further, the gas in the gas flow passage is rectified by the rectifying structure provided in the portion of the gas flow passage different from the gas retaining portion. Thereby, the moving direction of the gas in the gas flow passage is adjusted to the direction toward the gas discharge port and a circumferential component of the flow speed of the gas in the gas flow passage is reduced. Therefore, it is possible to improve uniformity of the spread of the gas which is discharged from the gas discharge port from the center side of the principal surface of the substrate to the peripheral edge side. As a result, it is possible to favorably protect the principal surface of the substrate by the gas discharged radially from the gas discharge port.

In the aspect of the present disclosure, the fluid nozzle includes a plurality of the gas discharge ports, and a plurality of the gas flow passages through which the gas is guided respectively to the plurality of gas discharge ports. The plurality of gas discharge ports have a first gas discharge port, and a second gas discharge port provided at a position further away from the principal surface of the substrate in the intersecting direction than the first gas discharge port.

With this configuration, in addition to the first gas discharge port, the gas is also discharged from the second gas discharge port provided at the position further away from the principal surface of the substrate than the first gas discharge port. Thus, it is possible to thicken a layer of the gas from the center side of the principal surface of the substrate to the peripheral edge side. Therefore, it is possible to more favorably protect the principal surface of the substrate.

In the aspect of the present disclosure, a width of the second gas discharge port in the intersecting direction is narrower than a width of the first gas discharge port in the intersecting direction.

When air enters the gas flow passage from the gas discharge port, oxygen and water vapor may be mixed into the gas discharged from the gas discharge port. By mixture of oxygen and water vapor into the gas discharged from the gas discharge port, the oxygen concentration and moisture in the atmosphere in the vicinity of the principal surface of the substrate may increase.

With the configuration that one more gas discharge port (second gas discharge port) is provided at the position further away from the substrate than the gas discharge port (first gas discharge port), ingress of air into the gas discharge port (first gas discharge port) which is relatively near the principal surface of the substrate is suppressed by the gas discharged from the gas discharge port (second gas discharge port) which is relatively far from the principal surface of the substrate. Meanwhile, since no further gas discharge port is provided at a position further away from the principal surface of the substrate than the second gas discharge port, there is no flow of a gas that suppresses ingress of air into the second gas discharge port. Thus, by making the width of the second gas discharge port in the intersecting direction narrower than the width of the first gas discharge port in the intersecting direction, it is possible to suppress the ingress of air into the second gas discharge port. Thereby, it is possible to suppress an increase in oxygen concentration in the atmosphere in the vicinity of the principal surface of the substrate. Thereby, it is possible to more favorably protect the principal surface of the substrate.

In the aspect of the present disclosure, a width of the second gas discharge port in the intersecting direction is wider than a width of the first gas discharge port in the intersecting direction.

When an atmospheric pressure in the vicinity of the principal surface of the substrate is relatively low, the gas discharged from the first gas discharge port which is relatively near the principal surface of the substrate is drawn to the principal surface side of the substrate in the intersecting direction, and the uniformity of the spread of the gas discharged from the first gas discharge port is lowered.

Thus, when the linear speed of the gas discharged from the first gas discharge port is increased by making the width of the first gas discharge port narrower than the width of the second gas discharge port, it is possible to suppress the gas discharged from the first gas discharge port from being drawn to the principal surface of the substrate. Therefore, it is possible to improve the uniformity of the spread of the gas which is discharged from the gas discharge port from the center side of the principal surface of the substrate to the peripheral edge side.

In the aspect of the present disclosure, the rectifying structure has a plurality of first shielding portions provided at intervals in the circumferential direction of the gas flow passage, the first shielding portions shield movement of the gas to a downstream side of the gas flow passage.

With this configuration, the movement of the gas to the downstream side of the gas flow passage is shielded by the plurality of first shielding portions provided at intervals in the circumferential direction. Therefore, at the time of passing through between the two first shielding portions adjacent to each other in the circumferential direction, the circumferential component of the flow speed of the gas is reduced. Thereby, it is possible to bring the discharging direction of the gas discharged from the gas discharge port close to the radial direction of the gas flow passage. Thus, it is possible to further improve the uniformity of the spread of the gas from the center side of the principal surface of the substrate to the peripheral edge side.

In the aspect of the present disclosure, the rectifying structure further has a plurality of second shielding portions provided on the downstream side of the plurality of first shielding portions in the gas flow passage, the second shielding portions shield movement of the gas to the downstream side of the gas flow passage. The positions of the plurality of second shielding portions in the circumferential direction are deviated from the positions of the plurality of first shielding portions in the circumferential direction.

The circumferential component of the flow speed of the gas passing through between the two first shielding portions adjacent to each other in the circumferential direction is reduced by the plurality of first shielding portions, whereas on the downstream side of the plurality of first shielding portions in the gas flow passage, a flow rate of the gas flowing through the same circumferential position as the first shielding portions is reduced. Thus, with the configuration that the circumferential positions of the plurality of second shielding portions that shield the movement of the gas to the downstream side of the gas flow passage are deviated from the circumferential positions of the plurality of first shielding portions on the downstream side of the plurality of first shielding portions in the gas flow passage, it is possible to reduce the flow rate of the gas flowing through the same circumferential positions as the second shielding portions. Thereby, it is possible to improve uniformity of the flow rate of the gas at the positions in the circumferential direction. As a result, it is possible to further improve the uniformity of the spread of the gas from the center side of the principal surface of the substrate to the peripheral edge side.

Further, it is possible to reduce a circumferential component of speed of the gas by the plurality of second shielding portions in addition to the plurality of first shielding portions. That is, it is possible to reduce the circumferential component of the speed of the gas in two stages. Thereby, it is possible to bring the discharging direction of the gas discharged from the gas discharge port closer to the radial direction of the gas flow passage.

In the aspect of the present disclosure, the gas flow passage further has a linear flow passage linearly extending in the intersecting direction, and a bending flow passage that bends an intermediate portion of the linear flow passage. By bending the intermediate portion of the linear flow passage, the flow speed of the gas is reduced and a flow speed difference of the gas between the positions in the circumferential direction of the gas flow passage is reduced. It is also possible to provide the rectifying structure in the bending flow passage.

In the aspect of the present disclosure, the fluid nozzle further includes a nozzle main body having an facing surface which faces the principal surface of the substrate and a side surface coupled to the facing surface, the side surface on which the gas discharge port is opened, the nozzle main body inside of which the gas flow passage is formed.

With this substrate processing apparatus, the gas discharge port is formed on the tubular side surface coupled to the facing surface which faces the principal surface of the substrate in the nozzle main body. Therefore, the gas is easily spread radially from the gas discharge port.

In the aspect of the present disclosure, the fluid nozzle further includes a center gas discharge port from which the gas is discharged toward the center of the principal surface of the substrate. A truncated-cone-shaped recessed portion recessed in the direction away from the principal surface of the substrate is formed on the facing surface of the fluid nozzle, and the center gas discharge port is placed in the recessed portion.

With this configuration, since the center gas discharge port is placed in the recessed portion, the gas discharged from the center gas discharge port toward the center of the principal surface of the substrate spreads in the recessed portion. Since the recessed portion is formed in a truncated cone shape, it is possible to evenly spread the gas from the entire region of a peripheral edge of the recessed portion to the outside of the recessed portion. Thereby, it is possible to improve the uniformity of the spread of the gas from the center side of the principal surface of the substrate to the peripheral edge side.

In the aspect of the present disclosure, the fluid nozzle further includes a processing liquid discharge port placed in the recessed portion, the processing liquid discharge port from which a processing liquid is discharged toward the principal surface of the substrate. Therefore, by discharging the gas from the gas discharge port which is opened from the side surface of the fluid nozzle while discharging the processing liquid to the principal surface of the substrate from the processing liquid discharge port, it is possible to protect the processing liquid on the principal surface of the substrate from the outside atmosphere. For example, it is possible to suppress oxygen and water vapor contained in the outside atmosphere from being dissolved in the processing liquid on the principal surface of the substrate.

Further, by discharging the gas from the center gas discharge port and pushing out the processing liquid to a peripheral edge of the substrate, it is possible to remove the processing liquid from the peripheral edge of the substrate. The gas discharged from the center gas discharge port is uniformly spread from the entire region of the peripheral edge of the recessed portion to the outside of the recessed portion. Thus, it is possible to favorably remove the processing liquid from the principal surface of the substrate.

In the aspect of the present disclosure, the nozzle main body includes a plurality of flow passage partition members each of which has a surface partitioning the gas flow passage. With this configuration, the gas flow passage is partitioned by the surfaces of the flow passage partition members. Therefore, in comparison with the configuration that the gas flow passage is formed inside a single member, the gas flow passage is more easily formed.

In the aspect of the present disclosure, the substrate processing apparatus further includes a gas pipe connected to the fluid nozzle, the gas pipe through which the gas is supplied to the gas flow passage from a direction parallel to the principal surface of the substrate.

Therefore, the gas supplied to the gas flow passage from the parallel direction with respect to the principal surface of the substrate is swirled in the circumferential direction in the gas flow passage. Since the rectifying structure is provided in the portion of the gas flow passage different from the gas retaining portion, the gas in the gas flow passage is rectified. Thereby, it is possible to improve the uniformity of the spread of the gas from the center side of the principal surface of the substrate to the peripheral edge side.

Another aspect of the present disclosure is to provide a substrate processing method including a substrate holding step of holding a substrate, a processing liquid supplying step of supplying a processing liquid to an upper surface of the substrate, and a gas flow forming step of, at least after the start of the processing liquid supplying step, discharging a gas from a gas discharge port of a fluid nozzle which has the gas discharge port from which the gas is discharged and a gas flow passage through which the gas is supplied to the gas discharge port, the fluid nozzle in which a gas retaining portion whose flow passage cross-sectional area is larger than other portions of the gas flow passage and a rectifying structure provided in a portion of the gas flow passage different from the gas retaining portion, the rectifying structure that rectifies a flow of the gas in the gas flow passage are provided in the gas flow passage, and forming a radial gas flow from the center side of the upper surface of the substrate to the peripheral edge side.

With this configuration, the same effects as the substrate processing apparatus described above are exerted.

The aforementioned as well as yet other objects, features, and effects of the present invention will be made clear by the following description of the preferred embodiments with reference to the accompanying drawings.

BRIEF DESCRIPTION OF THE DRAWINGS

FIG. 11 is a flowchart for describing a specific flow of substrate processing by the substrate processing apparatus.

FIG. 24 is an enlarged view of a plurality of side gas discharge ports and a periphery thereof in a section of a fluid nozzle according to a modified example.

DETAILED DESCRIPTION OF THE PREFERRED EMBODIMENTS

<Configuration of Substrate Processing Apparatus>

Figure 1:
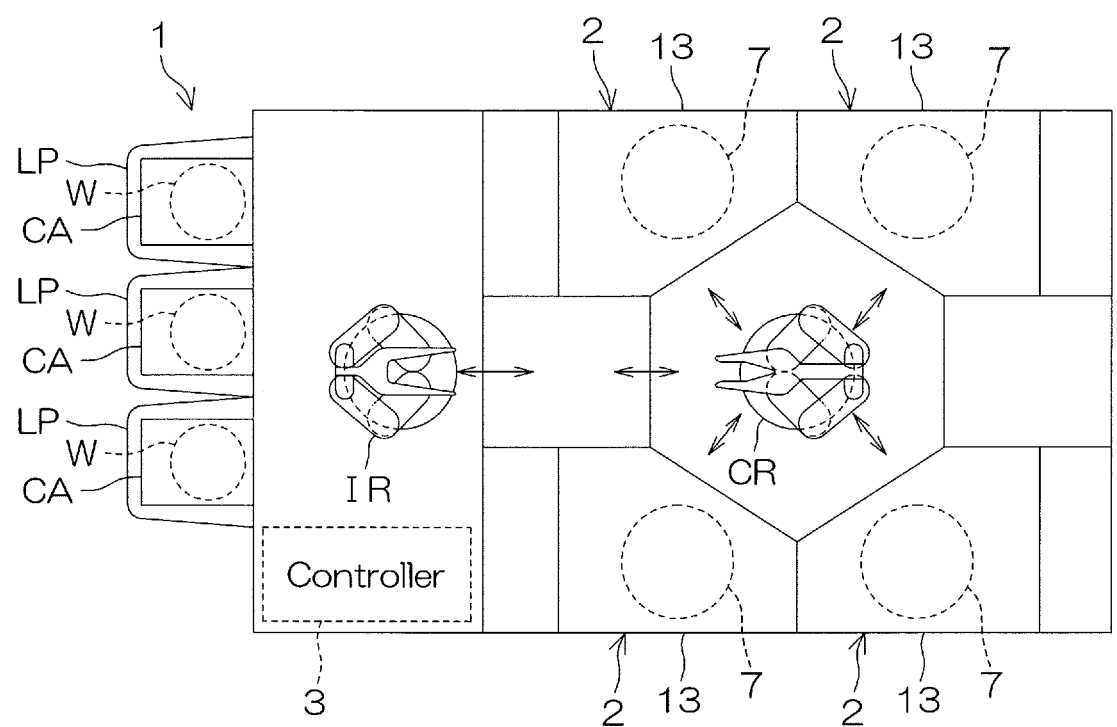
FIG. 1 is a plan view for describing a configuration of a substrate processing apparatus according to a first preferred embodiment of the present invention.

FIG. 1 is a plan view for describing a configuration of a substrate processing apparatus 1 according to a first preferred embodiment of the present invention.

The substrate processing apparatus 1 is a single substrate processing type apparatus that processes substrates W such as silicon wafers one at a time. In the present preferred embodiment, the substrate W is a disk-shaped substrate. The substrate processing apparatus 1 includes a plurality of processing units 2 that processes the substrates W with a processing liquid, load ports LP on which carriers CA housing the plurality of substrates W to be processed by the processing units 2 are mounted, transfer robots IR and IR that transfer the substrates W between the load ports LP and the processing units 2, and a controller 3 that controls the substrate processing apparatus 1. The transfer robot IR transfers the substrates W between the carriers CA and the transfer robot CR. The transfer robot CR transfers the substrates W between the transfer robot IR and the processing units 2. The plurality of processing units 2 have the same configuration, for example.

In each of the processing units 2, the substrate W having a pair of principal surfaces is processed in a posture in which any one of the principal surfaces is directed upward. At least one of the pair of principal surfaces is a device surface on which a circuit pattern is formed. One of the pair of principal surfaces may be a non-device surface on which a circuit pattern is not formed.

The circuit pattern may be, for example, a line-shaped pattern formed by minute trenches or may be formed by providing a plurality of minute pores (or voids).

Figure 2:
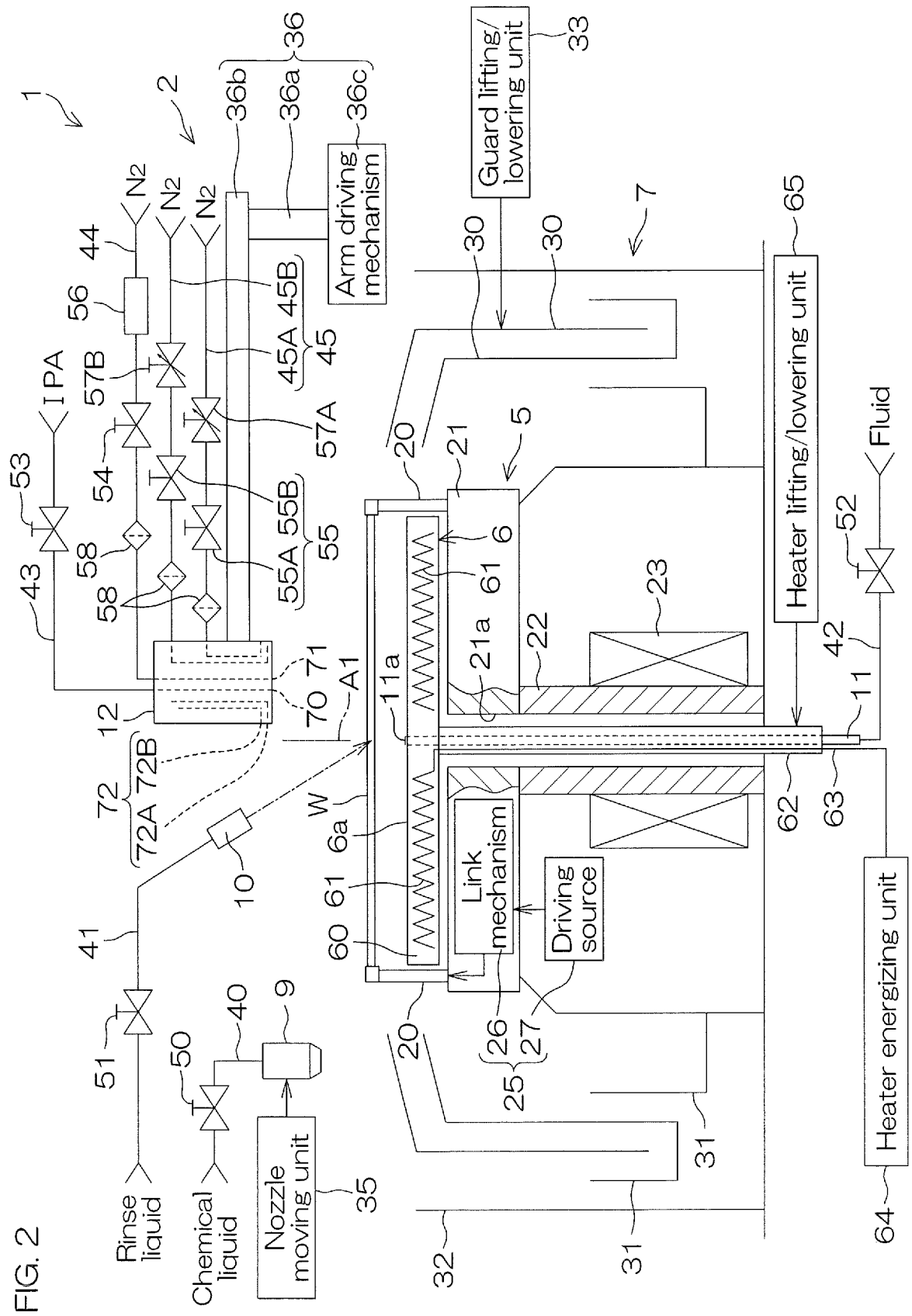
FIG. 2 is a schematic cross-sectional view for describing a configuration example of a processing unit provided in the substrate processing apparatus.

FIG. 2 is a schematic cross-sectional view for describing a configuration example of the processing unit 2. The processing unit 2 includes a spin chuck 5 that rotates the substrate W around a vertical rotation axis A1 passing through a central portion of the substrate W while holding the single substrate W in a horizontal posture, a heater unit 6 that heats the substrate W from the lower surface (principal surface on the lower side) side, a tubular processing cup 7 surrounding the spin chuck 5, a chemical liquid nozzle 9 that supplies a chemical liquid such as hydrofluoric acid to an upper surface of the substrate W, a rinse liquid nozzle 10 that supplies a rinse liquid such as deionized water (DIW) to the upper surface of the substrate W (principal surface on the upper side), a lower surface nozzle 11 that supplies a processing fluid to the lower surface of the substrate W, and a fluid nozzle 12 that supplies a gas such as a nitrogen gas ($N_2$) and a low surface tension liquid such as IPA (isopropyl alcohol) to the upper surface of the substrate W. The low surface tension liquid is a liquid whose surface tension is lower than the rinse liquid such as DIW.

The processing unit 2 further includes a chamber 13 (see FIG. 1) housing the processing cut 7. Although not shown in the figures, a carry-in/carry-out port for carrying in/out the substrate W is formed and a shutter unit that opens/closes the carry-in/carry-out port is provided in the chamber 13.

The spin chuck 5 rotates the substrate W while holding the substrate W at a predetermined holding position. Specifically, the spin chuck 5 includes a plurality of chuck pins 20 that grip the substrate W, a spin base 21 that supports the plurality of chuck pins 20, a rotation shaft 22 coupled to the center of a lower surface of the spin base 21, and a spin motor 23 that gives rotational force to the rotation shaft 22.

The rotation shaft 22 extends in the vertical direction along the rotation axis A1, and is a hollow shaft in the present preferred embodiment. The spin base 21 has a discoidal shape along the horizontal direction, and is coupled to an upper end of the rotation shaft 22. The plurality of chuck pins 20 are disposed in a peripheral edge portion of an upper surface of the spin base 21 at intervals from each other in the circumferential direction of the spin base 21. The plurality of chuck pins 20 can move between a closing position to be brought into contact with a peripheral edge portion of the substrate W to grip the substrate W and an opening position to be retreated from the peripheral edge portion of the substrate W. When placed at the opening position, the plurality of chuck pins 20 are brought into contact with a lower surface of the peripheral edge portion of the substrate W and support the substrate W from the lower side.

The plurality of chuck pins 20 are driven to open/close by a chuck pin driving unit 25. The chuck pin driving unit 25 includes, for example, a link mechanism 26 built in the spin base 21, and a driving source 27 disposed outside of the spin base 21. The driving source 27 includes, for example, a ball screw mechanism and an electric motor that gives driving force to the ball screw mechanism.

The heater unit 6 has a mode of a disk-shaped hot plate. The heater unit 6 is disposed between an upper surface of the spin base 21 and the lower surface of the substrate W.

The heater unit 6 includes a plate main body 60 and a heater 61. The plate main body 60 is slightly smaller than the substrate W in a plan view. An upper surface of the plate main body 60 forms a heating surface 6a. The heater 61 may be a resistance element built in the plate main body 60. The heating surface 6a is heated by energizing the heater 61.

A lifting/lowering shaft 62 extending in the vertical direction along the rotation axis A1 is coupled to a lower surface of the heater unit 6. The lifting/lowering shaft 62 is inserted into a through hole 21a formed in a central portion of the spin base 21 and the hollow rotation shaft 22. An electric supply wire 63 is passed through the interior of the lifting/lowering shaft 62.

Electricity is supplied from a heater energizing unit 64 to the heater 61 through the electric supply wire 63. The heater energizing unit 64 is, for example, a power source. The heater unit 6 is lifted and lowered by a heater lifting/lowering unit 65.

The heater lifting/lowering unit 65 includes, for example, an actuator (not shown) that drives to lift and lower the lifting/lowering shaft 62 such as an electric motor or an air cylinder. The heater lifting/lowering unit 65 is also referred to as a heater lifter.

The heater lifting/lowering unit 65 lifts and lowers the heater unit 6 through the lifting/lowering shaft 62. The heater unit 6 can be lifted and lowered by the heater lifting/lowering unit 65 and placed at a lower position and an upper position. The heater lifting/lowering unit 65 can dispose the heater unit 6 not only at the lower position and the upper position but also at an arbitrary position between the lower position and the upper position.

The heater unit 6 can receive the substrate W from the plurality of chuck pins 20 placed at the opening position at the time of being lifted. By being disposed at a contact position to be brought into contact with the lower surface of the substrate W or at a close position to become close to the lower surface of the substrate W without contact by the heater lifting/lowering unit 65, the heater unit 6 can heat the substrate W by radiation heat from the heating surface 6a. By placing the heater unit 6 at the contact position, by heat transfer from the heating surface 6a, it is possible to heat the substrate W by a larger heat amount.

The processing cup 7 receives the liquid scattered from the substrate W which is held by the spin chuck 5. The processing cup 7 includes a plurality of guards 30 that receive the liquid scattered outward from the substrate W which is held by the spin chuck 5, a plurality of cups 31 that receive the liquid guided downward by the plurality of guards 30, and a cylindrical outer wall member 32 surrounding the plurality of guards 30 and the plurality of cups 31. The present preferred embodiment shows an example in which two guards 30 and two cups 31 are provided.

Each of the guards 30 has a substantially cylindrical shape. An upper end portion of the guard 30 is inclined inward to the spin base 21. Each of the plurality of cups 31 is disposed below each of the plurality of guards 30. The cup 31 forms an annular liquid receiving groove that receives the processing liquid guided downward by the guard 30.

The guards 30 are individually lifted and lowered by the guard lifting/lowering unit 33. The guard lifting/lowering unit 33 places the guards 30 at arbitrary positions between the upper position and the lower position. FIG. 2 shows a state where both the two guards 30 are disposed at the lower position. The upper position is a position at which the upper end of the guard 30 is disposed above the holding position where the substrate W held by the spin chuck 5 is disposed. The lower position is a position at which the upper end of the guard 30 is disposed below the holding position.

The guard lifting/lowering unit 33 includes, for example, a plurality of ball screw mechanisms (not shown) respectively coupled to the plurality of guards 30, and a plurality of motors (not shown) that give driving force to the ball screw mechanisms. The guard lifting/lowering unit 33 is also referred to as a guard lifter.

When the liquid is supplied to the rotating substrate W, at least one of the guards 30 is disposed at the upper position. When the liquid is supplied to the substrate W in this state, the liquid is spun off the substrate W to the outside. The spun-off liquid collides with an inner surface of the guard 30 which horizontally faces the substrate W, and is guided to the cup 31 corresponding to this guard 30. When the transfer robot CR (see FIG. 1) accesses the spin chuck 5 upon carry-in and carry-out of the substrate W, all the guards 30 are placed at the lower position.

The chemical liquid nozzle 9 is a moving nozzle that can move in the horizontal direction in the present preferred embodiment. The chemical liquid nozzle 9 is moved in the horizontal direction by a first nozzle moving unit 35. The chemical liquid nozzle 9 can be moved between a center position and a home position (retreat position) in the horizontal direction. When placed at the center position, the chemical liquid nozzle 9 faces rotational center of the upper surface of the substrate W. The rotational center of the upper surface of the substrate W is a position to intersect the rotation axis A1 on the upper surface of the substrate W. When placed at the home position, the chemical liquid nozzle 9 does not face the upper surface of the substrate W, and is placed on the outside of the processing cup 7 in a plan view.

The chemical liquid nozzle 9 is connected to a chemical liquid pipe 40 through which the chemical liquid is guided to the chemical liquid nozzle 9. A chemical liquid valve 50 that opens/closes a flow passage in the chemical liquid pipe 40 is interposed with the chemical liquid pipe 40. When the chemical liquid valve 50 is opened, the chemical liquid is discharged downward from a discharge port of the chemical liquid nozzle 9 as a continuous flow. When the chemical liquid nozzle 9 is placed at the center position and the chemical liquid valve 50 is opened, the chemical liquid is supplied to a central region including the rotational center of the upper surface of the substrate W.

The chemical liquid nozzle 9 may be a fixed nozzle whose horizontal and vertical positions are fixed unlike the present preferred embodiment. The chemical liquid nozzle 9 may also have a mode of a double fluid nozzle capable of mixing and discharging a liquid and a gas unlike the present preferred embodiment.

A specific example of the chemical liquid discharged from the chemical liquid nozzle 9 is an etching liquid and a cleaning liquid. More specifically, the chemical liquid may be hydrofluoric acid, APM liquid (ammonia/hydrogen peroxide mixed solution), HPM liquid (hydrochloric acid/hydrogen peroxide mixed solution), buffered hydrofluoric acid (hydrofluoric acid/ammonium fluoride mixed solution), etc.

The rinse liquid nozzle 10 is a fixed nozzle disposed to discharge the rinse liquid toward the rotational center of the upper surface of the substrate W in the present preferred embodiment. A rinse liquid valve 51 that opens/closes a flow passage in a rinse liquid pipe 41 is interposed with the rinse liquid nozzle 10. When the rinse liquid valve 51 is opened, the rinse liquid is discharged downward from a discharge port of the rinse liquid nozzle 10 as a continuous flow and supplied to the central region of the upper surface of the substrate W. The rinse liquid nozzle 10 is not necessarily a fixed nozzle but may be a moving nozzle that moves at least in the horizontal direction.

The rinse liquid discharged from the rinse liquid nozzle 10 is not limited to DIW but may be any of carbonated water, electrolyzed ion water, hydrogen water, ozone water, ammonia water of dilute concentration (for example, about 10 ppm or more and 100 ppm or less), and aqueous hydrochloric acid solution of dilute concentration (for example, about 10 ppm or more and 100 ppm or less).

The lower surface nozzle 11 is inserted into the hollow lifting/lowering shaft 62 and further passes through the heater unit 6. The lower surface nozzle 11 has a discharge port 11a facing the central region of the lower surface of the substrate W at an upper end. A fluid pipe 42 through which a processing fluid is guided to the lower surface nozzle 11 is connected to the lower surface nozzle 11. A fluid valve 52 that opens/closes a flow passage in the fluid pipe 42 is interposed with the lower surface nozzle 11. When the fluid valve 52 is opened, the processing fluid is discharged upward from the discharge port 11a of the lower surface nozzle 11 as a continuous flow and supplied to the central region of the lower surface of the substrate W. The processing fluid to be supplied may be a liquid or a gas.

The fluid nozzle 12 is moved in the horizontal direction and the vertical direction by a second nozzle moving unit 36. The fluid nozzle 12 can be moved between a center position to face the rotational center of the upper surface of the substrate W and a home position (retreat position) that does not face the upper surface of the substrate W by moving in the horizontal direction. Therefore, the fluid nozzle 12 can be placed at a position to face the upper surface of the substrate W which is held by the spin chuck 5.

The home position that does not face the upper surface of the substrate W is a position on the outside of the spin base 21 in a plan view, or more specifically, may be a position on the outside of the processing cup 7. The fluid nozzle 12 can be brought close to the upper surface of the substrate W or retreated upward from the upper surface of the substrate W by moving in the vertical direction.

The second nozzle moving unit 36 includes, for example, a turning shaft 36a along the vertical direction, a horizontally extending arm 36b coupled to the turning shaft 36a, and an arm driving mechanism 36c that drives the arm 36b. The arm driving mechanism 36c oscillates the arm 36b by turning the turning shaft 36a around the vertical turning axis, and moves the arm 36b upward and downward by lifting and lowering the turning shaft 36a along the vertical direction. The fluid nozzle 12 is fixed to the arm 36b. Corresponding to oscillation, lifting, and lowering of the arm 36b, the fluid nozzle 12 is moved in the horizontal direction and the perpendicular direction. The arm driving mechanism 36c includes, for example, an actuator (not shown) such as an electric motor or an air cylinder.

In the present preferred embodiment, the fluid nozzle 12 has a function as a low surface tension liquid nozzle (processing liquid nozzle) that discharges the low surface tension liquid, and a function as a gas nozzle that discharges the gas. A low surface tension liquid pipe 43 (processing liquid pipe), a center gas pipe 44, and a plurality of side gas pipes 45 (including a first side gas pipe 45A and a second side gas pipe 45B) are coupled to the fluid nozzle 12.

A low surface tension liquid valve 53 (processing liquid valve) that opens/closes a flow passage of the low surface tension liquid pipe 43 is interposed with the low surface tension liquid pipe 43. A center gas valve 54 that opens/closes a flow passage of the center gas pipe 44 is interposed with the center gas pipe 44. A plurality of side gas valves 55 (including a first side gas valve 55A and a second side gas valve 55B) are respectively interposed with the plurality of side gas pipes 45. A flow passage in each of the side gas pipes 45 is opened/closed by the corresponding side gas valve 55.

A mass flow controller 56 to accurately adjust a flow rate of a gas flowing through a flow passage in the center gas pipe 44 is interposed with the center gas pipe 44 in addition to the center gas valve 54. A first flow rate variable valve 57A to adjust a flow rate of a gas flowing through a flow passage in the first side gas pipe 45A is interposed with the first side gas pipe 45A in addition to the first side gas valve 55A. A second flow rate variable valve 57B to adjust a flow rate of a gas flowing through a flow passage in the second side gas pipe 45B is interposed with the second side gas pipe 45B in addition to the second side gas valve 55B. Further, filters 58 to remove foreign substances are respectively interposed with the gas pipes (including the center gas pipe 44 and the plurality of side gas pipes 45).

The fluid nozzle 12 includes a low surface tension liquid discharge port (processing liquid discharge port) 70 that discharges the low surface tension liquid supplied from the low surface tension liquid pipe 43 downward as a continuous flow, a center gas discharge port 71 that discharges the gas supplied from the center gas pipe 44 downward in a linear form, and a plurality of side gas discharge ports 72 (including a first side gas discharge port 72A and a second side gas discharge port 72B) each of which discharges the gas supplied from the corresponding side gas pipe 45 radially in the horizontal direction. The gas discharged from the plurality of side gas discharge ports 72 forms a parallel gas flow 100 (see FIG. 3) that is a gas flow flowing in parallel to the upper surface of the substrate W. Both the first side gas discharge port 72A and the second side gas discharge port 72B are examples of the gas discharge port.

The low surface tension liquid discharged from the fluid nozzle 12 is, for example, an organic solvent such as IPA. The organic solvent functioning as the low surface tension liquid includes a liquid which contains at least one of IPA, HFE (hydrofluoroether), methanol, ethanol, acetone, PGEE (propylene glycol monoethyl ether), and trans-1,2-dichloroethylene, for example.

The organic solvent functioning as the low surface tension liquid does not necessarily consist of only a single component but may be a liquid mixed with other components. For example, the organic solvent may be a mixed solution of IPA and DIW or a mixed solution of IPA and HFE.

The gas discharged from the fluid nozzle 12 is not limited to a nitrogen gas. The gas discharged from the fluid nozzle 12 may be air. The gas discharged from the fluid nozzle 12 may be an inert gas other than a nitrogen gas. The inert gas is not limited to a nitrogen gas but is a gas which is inert to the upper surface of the substrate W. An example of the inert gas includes rare gases such as argon in addition to a nitrogen gas.

Figure 3:
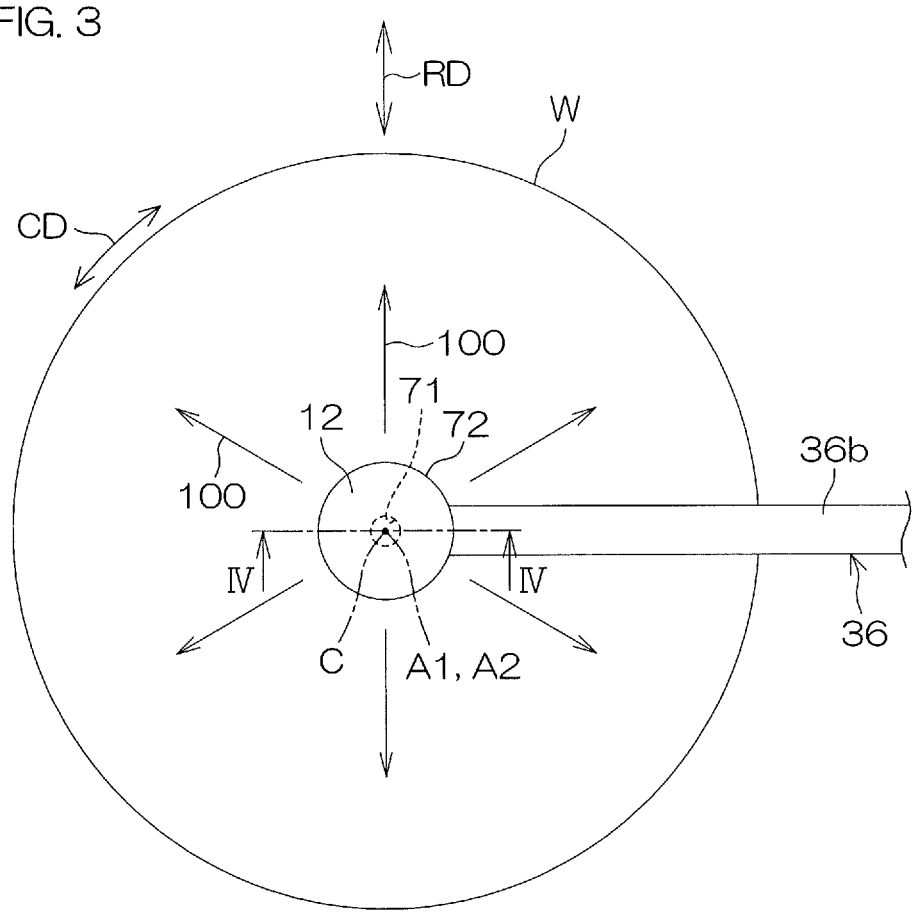
FIG. 3 is a schematic plan view of a fluid nozzle provided in the processing unit.

Next, a configuration of the fluid nozzle 12 will be described with reference to FIGS. 3 to 9. FIG. 3 is a schematic plan view for describing a configuration example of the fluid nozzle 12. FIG. 3 shows a state where the fluid nozzle 12 is placed at the center position.

With reference to FIG. 3, when the fluid nozzle 12 is placed at the center position, the center gas discharge port 71 faces a center C of the upper surface of the substrate W. Normally, the center C of the upper surface of the substrate W matches the rotational center of the upper surface of the substrate W. That is, a vertical center axis A2 passing through the center C of the upper surface of the substrate W matches the rotation axis A1. When the fluid nozzle 12 is placed at the center position, each of the side gas discharge port 72 discharges the gas radially from the center side of the upper surface of the substrate W to the peripheral edge side. Hereinafter, when no explanation is given, the configuration of the fluid nozzle 12 will be described on the premise that the fluid nozzle 12 is placed at the center position.

Figure 4:
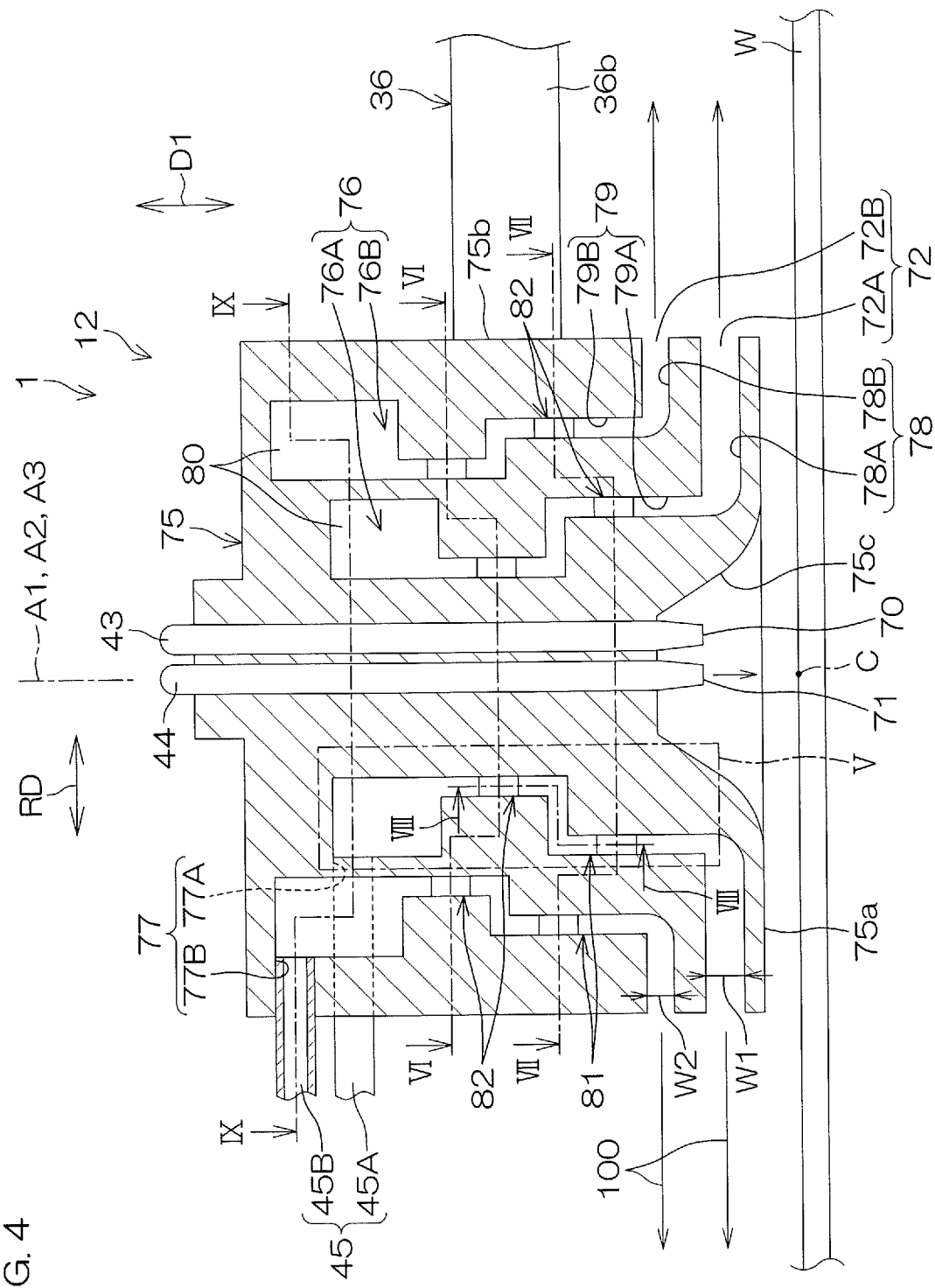
FIG. 4 is a sectional view taken along line IV-IV shown in FIG. 3.
Figure 5:
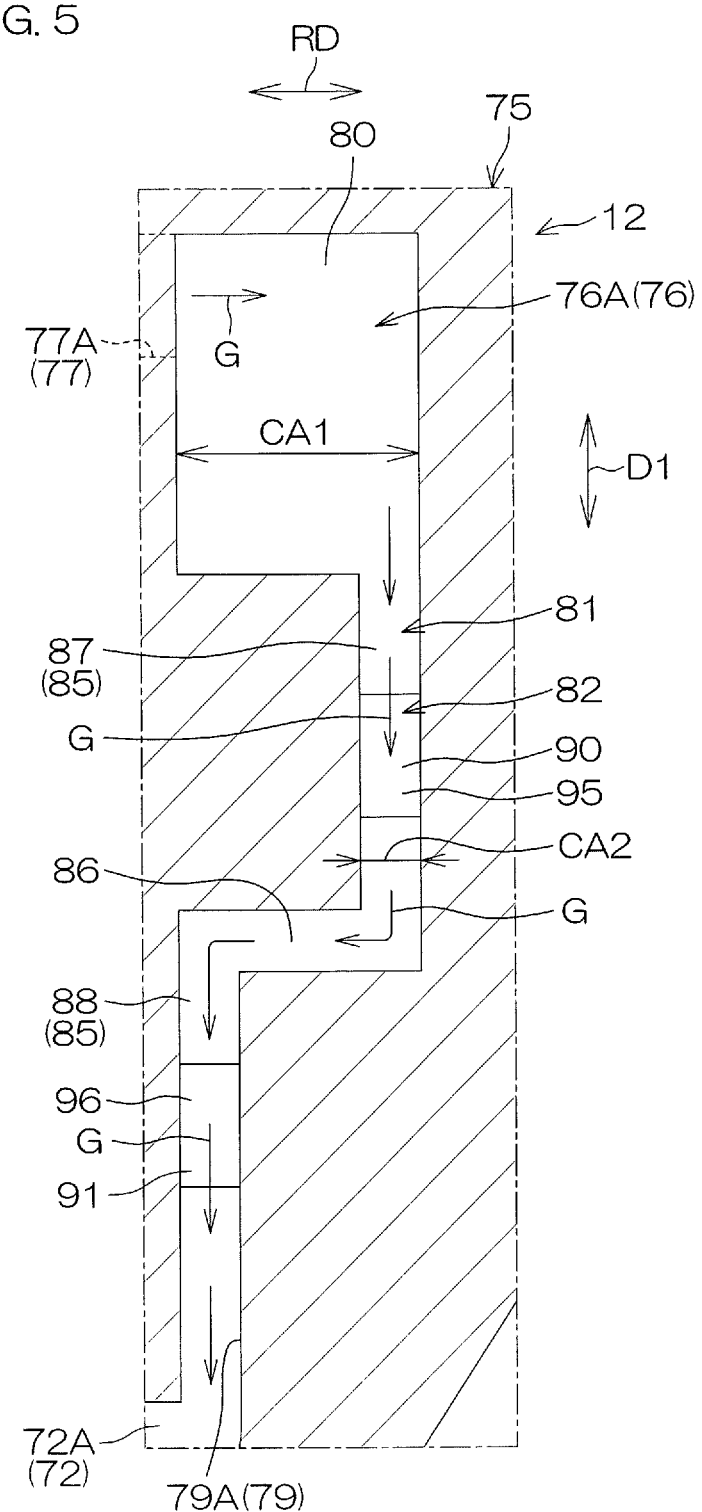
FIG. 5 is an enlarged view of a V region shown in FIG. 4.
Figure 6:
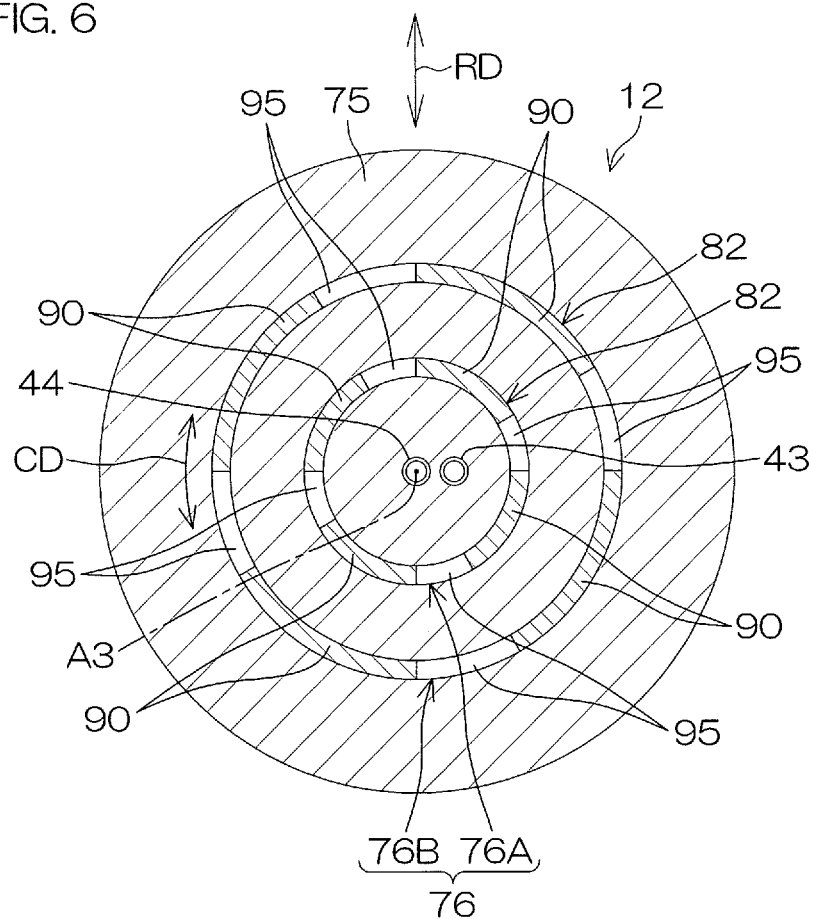
FIG. 6 is a cross-sectional view taken along line VI-VI shown in FIG. 4.
Figure 7:
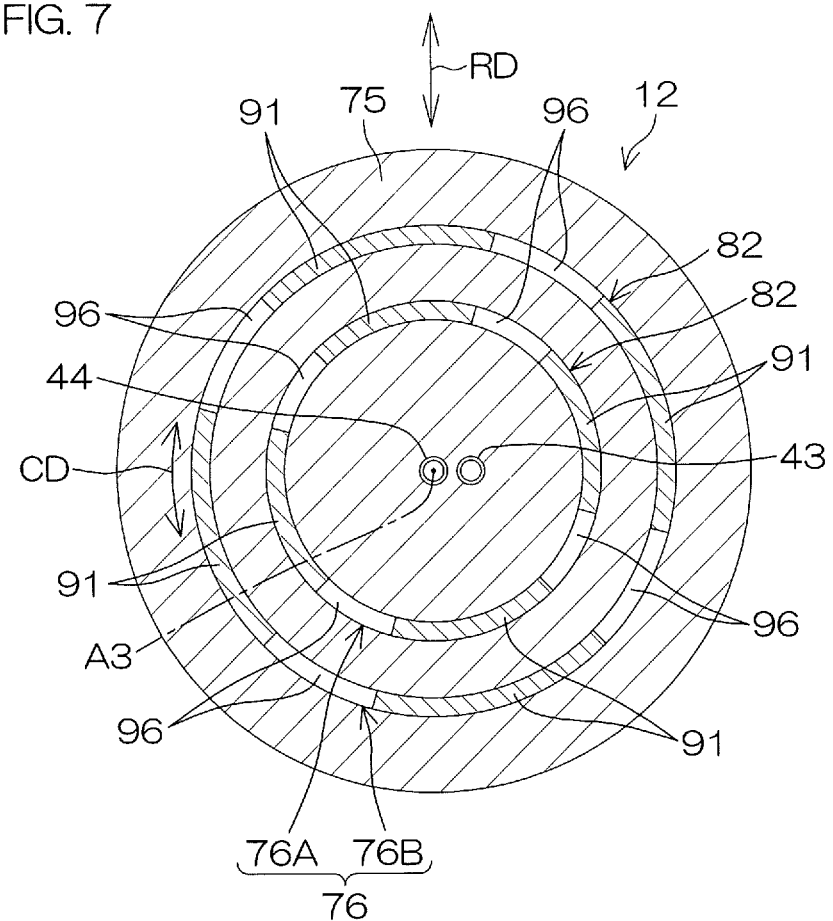
FIG. 7 is a cross-sectional view taken along line VII-VII shown in FIG. 4.
Figure 8:
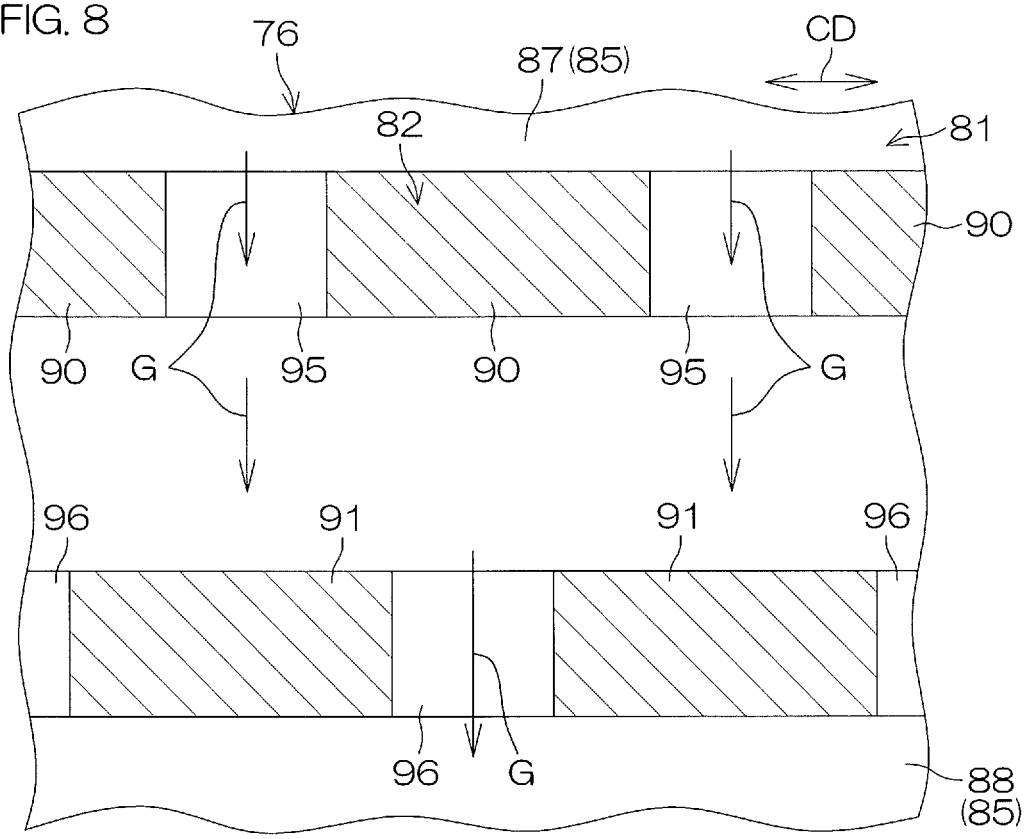
FIG. 8 is a cross-sectional view taken along line VIII-VIII shown in FIG. 4.
Figure 9:
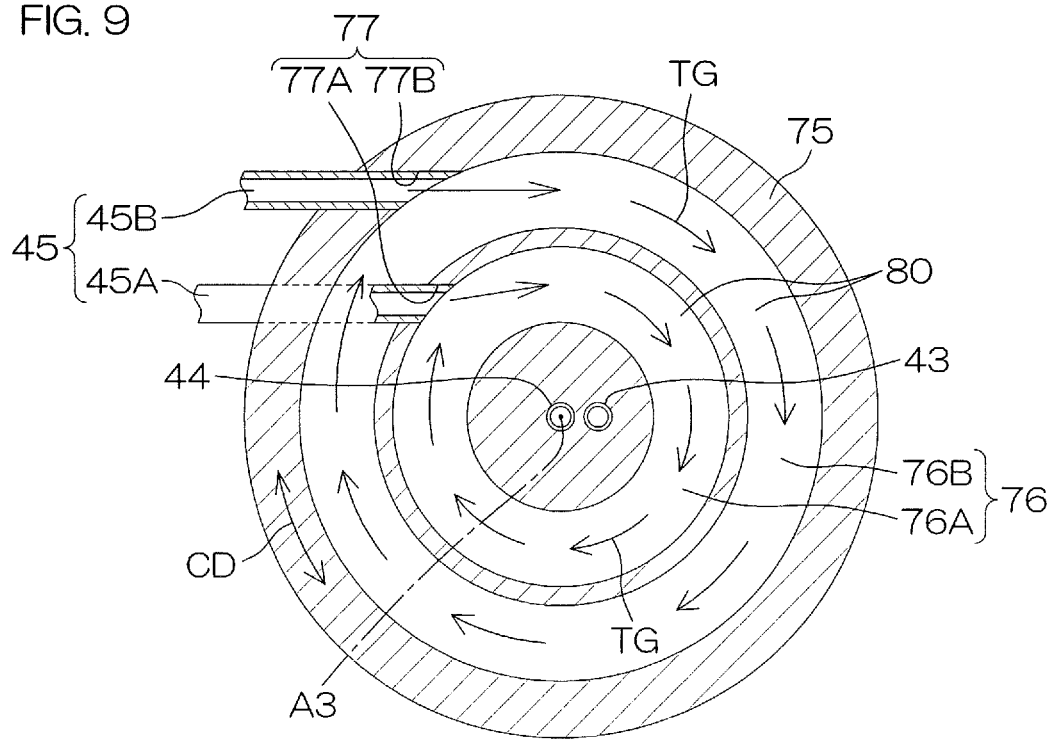
FIG. 9 is a cross-sectional view taken along line IX-IX shown in FIG. 4.

FIG. 4 is a cross-sectional view taken along line IV-IV shown in FIG. 3. FIG. 5 is an enlarged view of a V region shown in FIG. 4. FIG. 6 is a cross-sectional view taken along line VI-VI shown in FIG. 4. FIG. 7 is a cross-sectional view taken along line VII-VII shown in FIG. 4. FIG. 8 is a cross-sectional view taken along line VIII-VIII shown in FIG. 4. FIG. 9 is a cross-sectional view taken along line IX-IX shown in FIG. 4.

With reference to FIG. 4, the fluid nozzle 12 includes a nozzle main body 75 having a substantially columnar shape and extending in the vertical direction, a plurality of gas flow passages 76 (including a first gas flow passage 76A and a second gas flow passage 76B) through which the gas is supplied (guided) respectively to a plurality of side gas discharge ports 72 (including a first side gas discharge port 72A and a second side gas discharge port 72B), and a plurality of gas inflow ports 77 (including a first gas inflow port 77A and a second gas inflow port 77B) from which the gas flows into each of the plurality of gas flow passages 76 from the corresponding side gas pipe 45. Each of the side gas pipes 45 extends in the horizontal direction (direction parallel to the upper surface of the substrate W) and is inserted into the corresponding gas inflow ports 77.

The nozzle main body 75 has a bottom surface (lower surface) 75a, and a substantially cylindrical side surface 75b coupled to the bottom surface 75a, the side surface extending in the vertical direction. The bottom surface 75a is an facing surface which faces the upper surface of the substrate W in a state where the fluid nozzle 12 is placed at the center position. The plurality of side gas discharge ports 72 and the plurality of gas flow passages 76 are formed in the nozzle main body 75.

Each of the gas flow passages 76 has a substantially cylindrical shape along the vertical direction. The second gas flow passage 76B is provided on the outside of the first gas flow passage 76A and on the same axis as the first gas flow passage 76A. The first gas flow passage 76A and the second gas flow passage 76B are rotationally symmetric about a center line A3 thereof. When the fluid nozzle 12 is placed at the center position, the center line A3 of the gas flow passages 76 matches the rotation axis A1 and the center axis A2.

The first side gas discharge port 72A has a ring shape in a plan view and is opened from a lower end portion of the side surface 75b. The second side gas discharge port 72B has a ring shape in a plan view and is provided at a position in the side surface 75b further away from the upper surface of the substrate W than the first side gas discharge port 72A (position away from the bottom surface 75a). The gas discharged from each of the side gas discharge ports 72 spreads radially toward the outside of the side surface 75b.

The plurality of gas flow passages 76 are respectively connected to the plurality of side gas discharge ports 72.

Both the first side gas discharge port 72A and the second side gas discharge port 72B are rotationally symmetric about the center axis A2 of the substrate W (center line A3 of the gas flow passages 76). In other words, the second side gas discharge port 72B is placed on the same axis as the first side gas discharge port 72A. The side surface 75b is not necessarily entirely cylindrical but only a region of the side surface 75b where the plurality of side gas discharge ports 72 are opened may form a cylindrical surface.

A width W1 of the first side gas discharge port 72A in an intersecting direction D1 with respect to the upper surface of the substrate W (typically, the vertical direction) is larger than a width W2 of the second side gas discharge port 72B in the intersecting direction D1 with respect to the upper surface of the substrate W (typically, the vertical direction). The width W1 is, for example, 3 mm or more and 4 mm or less, and the width W2 is, for example, 2 mm or more and 3 mm or less.

Each of the side gas discharge ports 72 is partitioned by a pair of discharge port partition surfaces 78 (including an upper discharge port partition surface 78A and a lower discharge port partition surface 78B) formed inside the nozzle main body 75. Each of the gas flow passages 76 is partitioned by a pair of flow passage partition surfaces 79 (including an inner flow passage partition surface 79A and an outer flow passage partition surface 79B) formed inside the nozzle main body 75. The pair of flow passage partition surfaces 79 are respectively coupled to the pair of discharge port partition surfaces 78.

A substantially truncated-cone-shaped recessed portion 75c recessing the nozzle main body 75 is formed on the bottom surface 75a of the nozzle main body 75. The recessed portion 75c is recessed in the direction away from the upper surface of the substrate W (intersecting direction D1, typically, the vertical direction).

The center gas pipe 44 and the low surface tension liquid pipe 43 are inserted into a central portion of the nozzle main body 75 in parallel to the central line A3. Lower end portions of the center gas pipe 44 and the low surface tension liquid pipe 43 are placed in the recessed portion 75c of the nozzle main body 75. The lower end portion of the center gas pipe 44 forms the center gas discharge port 71. The lower end portion of the low surface tension liquid pipe 43 forms the low surface tension liquid discharge port 70. The center gas discharge port 71 and the low surface tension liquid discharge port 70 are placed in the recessed portion 75c. The low surface tension liquid discharge port 70 is placed on the side of the center gas discharge port 71.

The gas flow passages 76 have the same configuration. Therefore, hereinafter, details of the gas flow passages 76 will be described with reference to FIG. 5 showing a periphery of the first gas flow passage 76A in FIG. 4 in an enlarged manner. Each of the gas flow passages 76 includes a gas retaining portion 80 whose flow passage cross-sectional area is larger than other portions of the gas flow passage 76, the gas retaining portion 80 inside of which a gas G is retained, a narrow flow passage that couples the gas retaining portion 80 and the corresponding side gas discharge port 72, the narrow flow passage 81 whose flow passage cross-sectional area is smaller than the gas retaining portion 80, and a rectifying structure 82 provided in the narrow flow passage 81 (portion of the gas flow passage 76 different from the gas retaining portion 80), the rectifying structure that rectifies a flow of the gas of the gas flow passage 76.

The flow passage cross-sectional area is an area of a section along an orthogonal direction to the direction along the gas flow passage 76 (flow passage direction). A flow passage cross-sectional area CA1 of the gas retaining portion 80 is a cross-sectional area of the gas flow passage 76 along the horizontal direction.

In the first preferred embodiment, the narrow flow passage 81 includes a linear flow passage 85 that connects a downstream end of the gas retaining portion 80 and an upstream end of the corresponding side gas discharge port 72, the linear flow passage 85 linearly extending in the intersecting direction D1 with respect to the circumferential direction CD around the center line A3 of the gas flow passage 76 (which is typically, an orthogonal direction, that is also the vertical direction), and a bending flow passage 86 that bends an intermediate portion of the linear flow passage 85. The linear flow passage 85 includes an upstream linear flow passage 87 connected to the downstream end of the gas retaining portion 80 and an upstream end of the bending flow passage 86, the upstream linear flow passage 87 linearly extending in the intersecting direction D1, and a downstream linear flow passage 88 connected to the corresponding side gas discharge port 72 and a downstream end of the bending flow passage 86, the downstream linear flow passage 88 linearly extending in the intersecting direction D1. The bending flow passage 86 is a flow passage formed in a ring shape in a plan view spreading in the horizontal direction.

The rectifying structure 82 includes a plurality of first shielding portions 90 that shield movement of the gas to the downstream side of the gas flow passage 76, and a plurality of second shielding portions 91 provided on the downstream side of the plurality of first shielding portions 90 in the gas flow passage 76, the second shielding portions shield movement of the gas to the downstream side of the gas flow passage 76. In the first preferred embodiment, the plurality of first shielding portions 90 are provided in the upstream linear flow passage 87, and the plurality of second shielding portions 91 are provided in the downstream linear flow passage 88.

With reference to FIG. 6, the plurality of first shielding portions 90 are provided at intervals in the circumferential direction CD. The gas G in the upstream linear flow passage 87 (see FIG. 8) passes through a gap between the adjacent first shielding portions 90 (first rectifying flow passage 95) and flows to the downstream side. With reference to FIG. 7, the plurality of second shielding portions 91 are also provided at intervals in the circumferential direction CD. The gas G in the downstream linear flow passage 88 (see FIG. 8) passes through a gap between the adjacent second shielding portions 91 (second rectifying flow passage 96) and flows to the downstream side.

With reference to FIG. 8, the positions of the plurality of second shielding portions 91 in the circumferential direction CD (circumferential phases of the second shielding portions 91) are deviated from the positions of the plurality of first shielding portions 90 in the circumferential direction CD (circumferential phases of the first shielding portions 90). In other words, the circumferential phases of the plurality of second shielding portions 91 are different from the circumferential phases of the plurality of first shielding portions 90. Each of the first rectifying flow passages 95 between the adjacent second shielding portions 91 has a linear shape along the intersecting direction D1. Each of the second rectifying flow passages 96 between the adjacent second shielding portions 91 has a linear shape along the intersecting direction D1. The positions of the plurality of second rectifying flow passages 96 in the circumferential direction CD are deviated from the positions of the plurality of first rectifying flow passages 95 in the circumferential direction CD. In other words, circumferential phases of the plurality of second rectifying flow passages 96 are different from circumferential phases of the plurality of first rectifying flow passages 95.

By using such a fluid nozzle 12, the following effects are exerted. Each of the gas inflow ports 77 allows the gas G to flow into the gas retaining portion 80 of the corresponding gas flow passage 76 from the circumferential direction CD of the gas flow passage 76 (direction parallel to the upper surface of the substrate W) (see FIG. 5). As shown in FIG. 9, the gas G supplied to the gas retaining portion 80 forms a swirling gas flow TG in the gas retaining portion 80 along the circumferential direction CD. The flow passage cross-sectional area CA1 of the gas retaining portion 80 is larger than a flow passage cross-sectional area CA2 of other portions of the gas flow passage 76. That is, the inside of the gas retaining portion 80 is a large space. Therefore, the gas G is dispersed in the gas retaining portion 80. Thus, the flow speed of the gas G supplied into the gas retaining portion 80 is reduced, and a flow speed difference of the gas G between the positions in the circumferential direction CD of the gas flow passage 76 is reduced. That is, the gas flowing into the gas retaining portion 80 is retained in the gas retaining portion 80.

The gas G in the gas retaining portion 80 flows into the narrow flow passage 81 from the downstream end of the gas retaining portion 80. The gas G flowing through the inside of the narrow flow passage 81 is rectified by the rectifying structure 82, and a circumferential component of the flow speed of the gas G is reduced. Thereby, the moving direction of the gas G is adjusted to the direction along the gas flow passage 76. In detail, a part of the upstream linear flow passage 87 in the circumferential direction CD is blocked by the plurality of shielding portions 90. Thus, at the time of passing through between the two first shielding portions 90 adjacent to each other in the circumferential direction CD (first rectifying flow passage 95), the circumferential component of the flow speed of the gas is reduced.

While the circumferential component of the flow speed of the gas G passing through the first rectifying flow passages 95 is reduced, on the downstream side of the plurality of first shielding portions 90 in the gas flow passage 76, the flow rate of the gas G flowing through the same circumferential position as the first shielding portions 90 is reduced. In the first preferred embodiment, on the downstream side of the plurality of first shielding portions 90 in the gas flow passage 76, the plurality of second shielding portions 91 that shield the movement of the gas G to the downstream side of the gas flow passage 76 are disposed at the positions deviated from the plurality of first shielding portions 90 in the circumferential direction CD. Therefore, it is possible to reduce the flow rate of the gas G flowing through the same circumferential position as the second shielding portions 91. Thereby, it is possible to improve uniformity of the flow rate of the gas G at the positions in the circumferential direction CD. The circumferential component of the speed of the gas G is reduced in two stages by the plurality of first shielding portions 90 and the plurality of second shielding portions 91. Thereby, it is possible to bring the moving direction of the gas G flowing through the gas flow passage 76 closer to a radial direction RD.

When the gas flows through the narrow flow passage 81, the gas flows into the bending flow passage 86 from the upstream linear flow passage 87. At that time, the gas collides with a portion partitioning the bending flow passage 86 on the flow passage partition surface 79, and the flow speed of the gas is reduced. Thereby, the flow speed difference of the gas between the positions in the circumferential direction CD is further reduced. The gas passed through the interior of the narrow flow passage 81 is discharged radially from the corresponding side gas discharge port 72.

In such a way, by the gas retaining portion 80 and the bending flow passage 86, the flow speed of the gas is reduced, and the flow speed difference of the gas in the circumferential direction CD is reduced. Therefore, it is possible to improve uniformity of the spread of the gas G (parallel gas flow 100) which is discharged from the corresponding side gas discharge port 72 from the center side of the upper surface of the substrate W to the peripheral edge side. By the rectifying structure 82, the circumferential component of the flow speed of the gas is reduced, and the discharging direction of the gas from the side gas discharge port 72 is adjusted to the direction along the gas flow passage 76 (here, the radial direction RD). As a result, it is possible to favorably protect the upper surface of the substrate W.

The gas retaining portion 80 is provided on the most upstream side of the gas flow passage 76 (upstream side of the narrow flow passage 81). Therefore, it is possible to sufficiently ensure the flow passage through which the gas G whose flow speed is reduced by the gas retaining portion 80 flows. Thus, the gas G is easily rectified to the desired direction.

In addition to the first side gas discharge port 72A, the gas is also discharged from the second side gas discharge port 72B provided at the position further away from the upper surface of the substrate W than the first side gas discharge port 72A. Thus, it is possible to thicken a layer of the gas (parallel air flow 100) from the center side of the upper surface of the substrate W to the peripheral edge side. Therefore, it is possible to more favorably protect the upper surface of the substrate W.

The side gas discharge port 72 is formed on the tubular side surface 75b coupled to the bottom surface 75a which faces the upper surface of the substrate W in the nozzle main body 75. Therefore, the gas is easily spread radially from the side gas discharge port 72.

Since the center gas discharge port 71 is placed in the recessed portion 75c, the gas discharged from the center gas discharge port 71 toward the center C of the upper surface of the substrate W spreads in the recessed portion 75c and is filled between the upper surface of the substrate W and the recessed portion 75c. Since the recessed portion 75c is formed in a truncated cone shape, it is possible to evenly spread the gas from the entire region of a peripheral edge of the recessed portion 75c to the outside of the recessed portion 75c. Thereby, it is possible to improve the uniformity of the spread of the gas from the center C side of the upper surface of the substrate W to the peripheral edge side.

Figure 10:
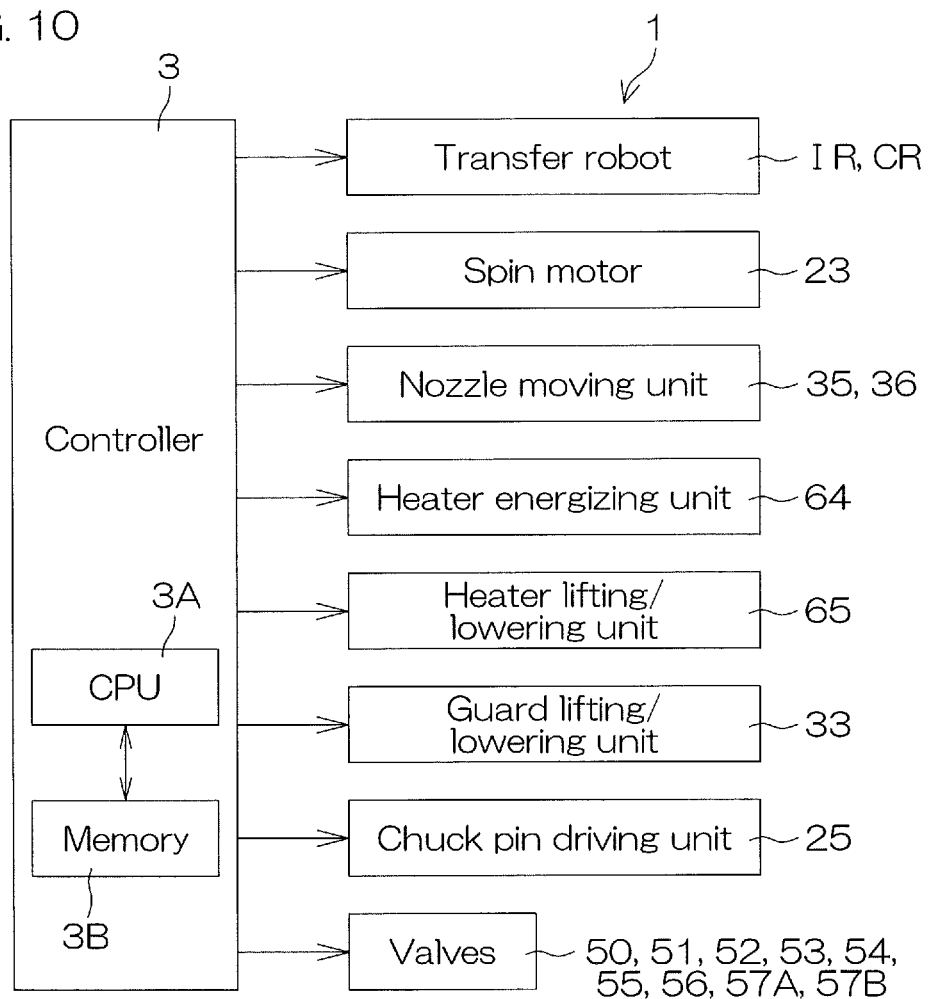
FIG. 10 is a block diagram for describing an electrical configuration of the substrate processing apparatus.

FIG. 10 is a block diagram for describing an electrical configuration of major portions of the substrate processing apparatus 1. The controller 3 includes a microcomputer and controls control targets provided in the substrate processing apparatus 1 according to a predetermined control program.

Specifically, the controller 3 includes a processor (CPU) 3A, and a memory 3B in which the control program is stored. The controller 3 is configured to execute various controls for substrate processing by executing the control program by the processor 3A.

Particularly, the controller 3 is programmed to control the transfer robots IR, CR, the spin motor 23, the first nozzle moving unit 35, the second nozzle moving unit 36, the heater energizing unit 64, the heater lifting/lowering unit 65, the guard lifting/lowering unit 33, the chuck pin driving unit 25, the chemical liquid valve 50, the rinse liquid valve 51, the fluid valve 52, the low surface tension liquid valve 53, the center gas valve 54, the side gas valves 55, the mass flow controller 56, the first flow rate variable valve 57A, and the second flow rate variable valve 57B. By controlling the valves by the controller 3, discharge/non-discharge of the fluid from the corresponding valves and the discharge flow rate of the fluid from the corresponding nozzles are controlled.

The following steps are executed by controlling these configurations by the controller 3. In other words, the controller 3 is programmed to execute the following steps.

FIG. 11 is a flowchart for describing an example of the substrate processing by the substrate processing apparatus 1, mainly showing processing to be realized by executing an operating program by the controller 3. In the substrate processing by the substrate processing apparatus 1, for example, as shown in FIG. 11, chemical liquid processing (Step S1), rinsing processing (Step S2), low surface tension liquid processing (Step S3), and drying processing (Step S4) are executed in this order.

Hereinafter, the substrate processing executed by the substrate processing apparatus 1 will be described mainly with reference to FIGS. 2 and 11.

An unprocessed substrate W is carried into the processing unit 2 from the carrier CA by the transfer robots IR, CR and handed to the spin chuck 5 (substrate carry-in step). At this time, the heater unit 6 is disposed at the lower position. The chuck pin driving unit 25 moves the chuck pins 20 to the opening position. In that state, the transfer robot CR hands the substrate W to the spin chuck 5. After this, the substrate W is held by the spin chuck 5 until the substrate W is carried out by the transfer robot CR (substrate holding step). After that, the chuck pin driving unit 25 moves the plurality of chuck pins 20 to the closing position. Thereby, the substrate W is gripped by the plurality of chuck pins 20.

After the transfer robot CR is retreated out of the processing unit 2, the chemical liquid processing (Step S1) is started. The controller 3 drives the spin motor 23 and rotates the spin base 21 at a predetermined chemical liquid rotational speed. Meanwhile, the first nozzle moving unit 35 disposes the chemical liquid nozzle 9 at a chemical liquid processing position above the substrate W. The chemical liquid processing position may be the center position. The chemical liquid valve 50 is then opened. Thereby, the chemical liquid such as hydrofluoric acid is supplied from the chemical liquid nozzle 9 toward the upper surface of the substrate W in a rotating state. The supplied chemical liquid is diffused over the entire surface of the substrate W by centrifugal force.

After the chemical liquid processing for a fixed period of time, by replacing the chemical liquid on the substrate W with the rinse liquid such as DIW, the rinsing processing to remove the chemical liquid from the upper side of the substrate W (Step S2) is executed. Specifically, the chemical liquid valve 50 is closed, and instead, the rinse liquid valve 51 is opened. Thereby, the rinse liquid is supplied from the rinse liquid nozzle 10 toward the upper surface of the substrate W in a rotating state. The supplied rinse liquid is diffused over the entire surface of the substrate W by centrifugal force. The chemical liquid on the substrate W is washed off by this rinse liquid. During this time, the first nozzle moving unit 35 retreats the chemical liquid nozzle 9 from the upper side of the substrate W to the side of the processing cup 7.

After the rinsing processing for a fixed period of time, the low surface tension liquid processing of replacing the rinse liquid on the substrate W with the low surface tension liquid such as IPA (Step S3) is executed. FIGS. 12A to 12D are schematic views for describing states of the low surface tension liquid processing of the substrate processing executed by the substrate processing apparatus 1. Hereinafter, in addition to FIGS. 2 and 11, FIGS. 12A to 12D will be referred to appropriately.

Specifically, the second nozzle moving unit 36 moves the fluid nozzle 12 to a low surface tension liquid processing position above the substrate W. The low surface tension liquid processing position may be a position where the low surface tension liquid discharged from the low surface tension liquid discharge port 70 which is provided in the fluid nozzle 12 lands on the rotational center of the upper surface of the substrate W.

Figure 12A:
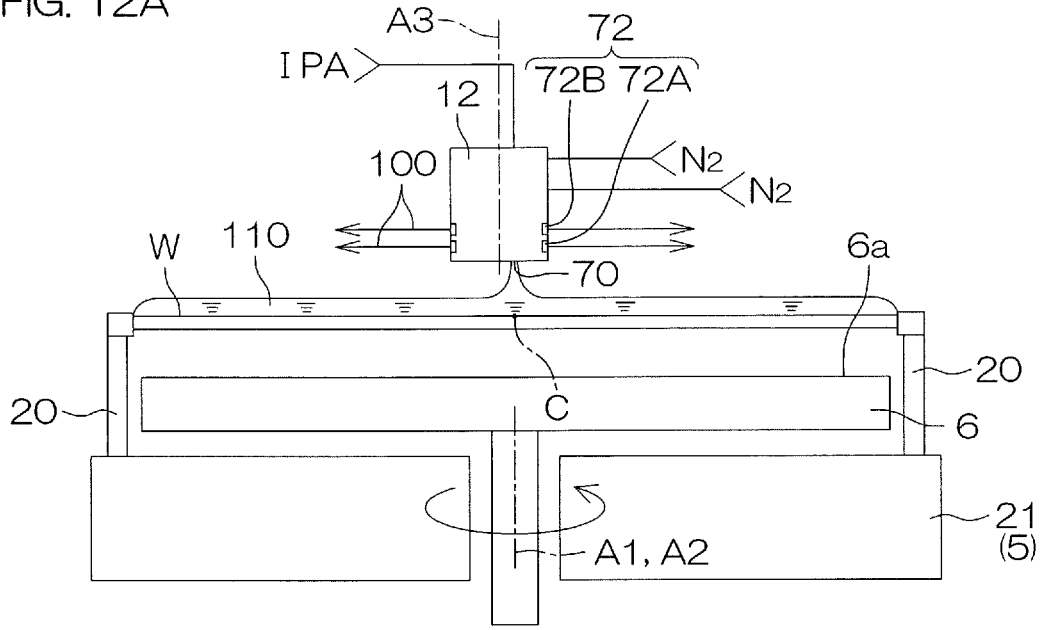
FIGS. 12A to 12D are illustrative cross-sectional views for describing states of low surface tension liquid processing executed in the substrate processing.

The rinse liquid valve 51 is then closed and discharge of the rinse liquid from the rinse liquid nozzle 10 is stopped. In a state where the discharge of the rinse liquid from the rinse liquid nozzle 10 is stopped, the first side gas valve 55A and the second side gas valve 55B are opened. Thereby, from the first side gas discharge port 72A and the second side gas discharge port 72B of the fluid nozzle 12, the gas is discharged radially from the center C side of the substrate W to the peripheral edge side (gas discharging step). Thereby, as shown in FIG. 12A, the parallel gas flow 100 is formed, and the entire region of the upper surface of the substrate W (to be exact, the outside region of the fluid nozzle 12 in a plan view) is covered by the parallel gas flow 100 (gas forming step, upper surface covering step).

In that state, the low surface tension liquid valve 53 is opened. Thereby, the low surface tension liquid is supplied from the fluid nozzle 12 (low surface tension liquid discharge port 70) toward the upper surface of the substrate W in a rotating state (low surface tension liquid supplying step, processing liquid supplying step). The supplied low surface tension liquid is diffused over the entire surface of the substrate W by centrifugal force, and replaced with the rinse liquid on the substrate W. Thereby, a liquid film 110 of the low surface tension liquid is formed on the upper surface of the substrate W (liquid film forming step).

Figure 12B:
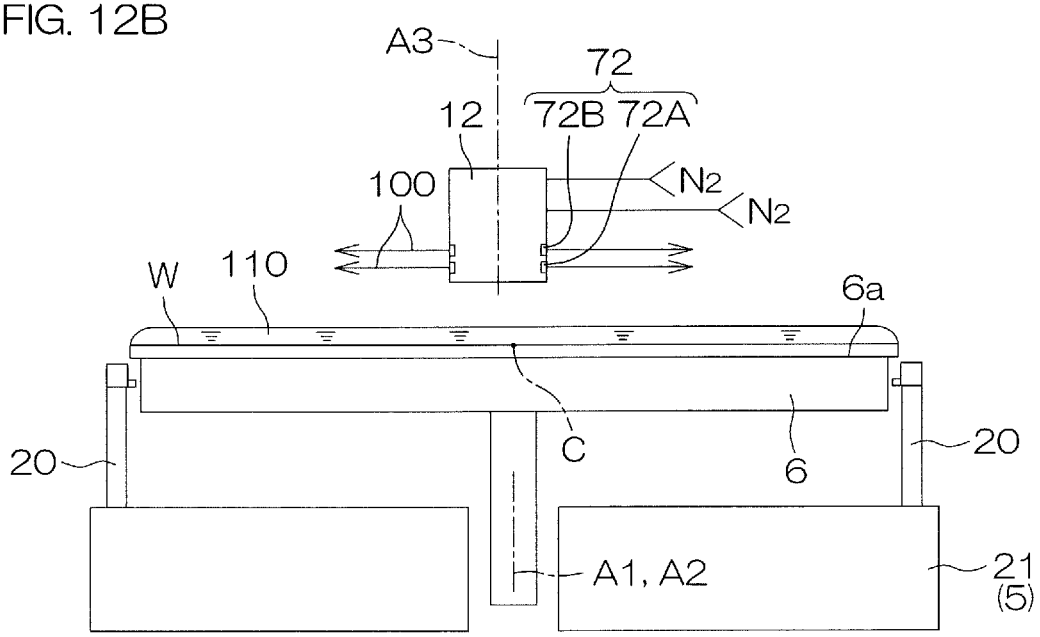

In the low surface tension liquid processing, the spin motor 23 decelerates rotation of the spin chuck 5 and stops rotation of the substrate W. The low surface tension liquid valve 53 is then closed and supply of the low surface tension liquid is stopped. Thereby, as shown in FIG. 12B, a puddle state in which the liquid film 110 is supported on the substrate W in a static state is provided. In a state where the rotation is stopped, the chuck pin driving unit 25 moves the plurality of chuck pins 20 to the opening position, and the heater lifting/lowering unit 65 lifts the heater unit 6 toward the substrate W. Thereby, the heater unit 6 receives the substrate W from the plurality of chuck pins 20. The heater unit 6 heats the substrate W in a state where the substrate W is brought up. By heating the substrate W, part of the low surface tension liquid in contact with the upper surface of the substrate W is evaporated, and thereby, a gas phase layer is formed between the liquid film 110 and the upper surface of the substrate W. The liquid film 110 supported by the gas phase layer is removed. The gas phase layer is preferably formed to have a thickness such that the low surface tension liquid does not enter recessed portions (trenches, minute pores) of the circuit pattern on the upper surface of the substrate W. By doing so, it is possible to reduce surface tension of the low surface tension liquid acting on the circuit pattern.

Figure 12C:
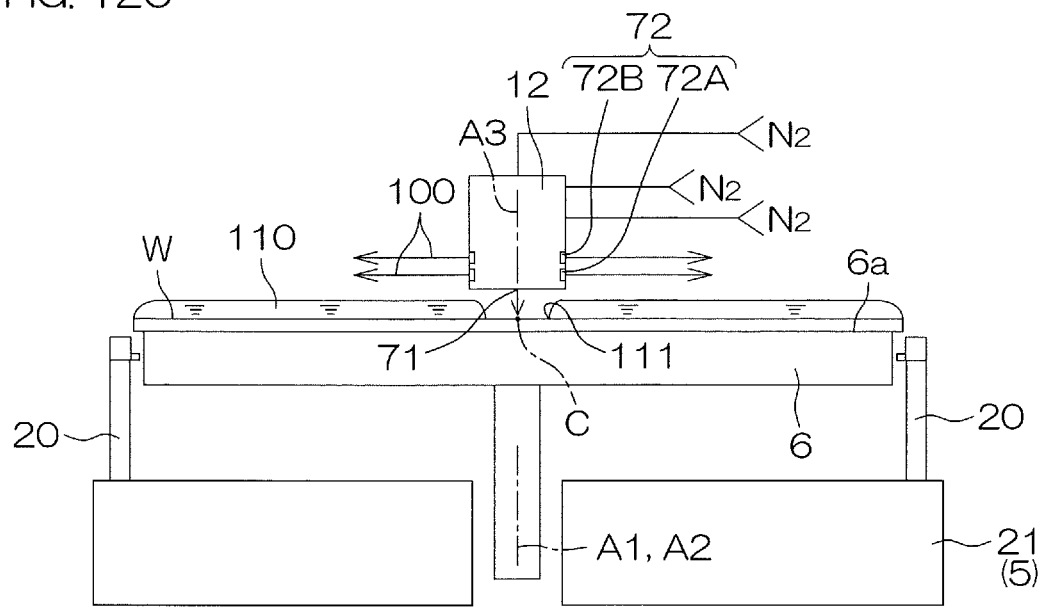
Figure 12D:
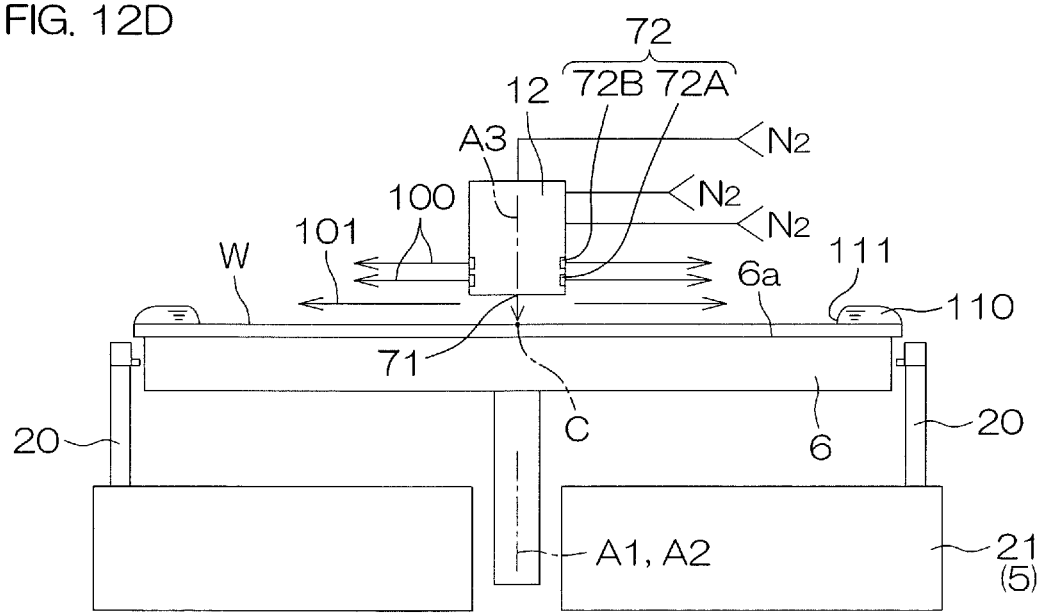

Upon removal of the liquid film 110 of the low surface tension liquid, the second nozzle moving unit 36 moves the fluid nozzle 12 to the center position. The center gas valve 54 is then opened. Thereby, as shown in FIG. 12C, the gas is linearly discharged from the center gas discharge port 71 toward the liquid film 110 on the substrate W (perpendicular gas discharging step). At the position where discharge of the gas is received, that is, in the center C of the substrate W, the liquid film 110 is removed by the gas, and an opening 111 to expose the upper surface of the substrate W is formed in the center of the liquid film 110 (opening forming step). The gas supplied toward the upper surface of the substrate W forms a parallel gas flow 101 spreading radially along the upper surface of the substrate W. As shown in FIG. 12D, by continuing the discharge of the gas from the center gas discharge port 71, the low surface tension liquid is pushed away toward a peripheral edge of the substrate W by the parallel gas flow 101, and the opening 111 is enlarged. By enlarging the opening 111, the low surface tension liquid on the substrate W is emitted out of the substrate W (opening enlarging step, liquid film removing step).

By doing this, after the low surface tension liquid processing is finished, the spin motor 23 rotates the substrate W at high drying rotational speed. Thereby, the drying processing to spin off a liquid component on the substrate W by centrifugal force (Step S4) is performed.

After that, the second nozzle moving unit 36 retreats the fluid nozzle 12, and further, the spin motor 23 stops the rotation of the spin chuck 5. The heater lifting/lowering unit 65 moves the heater unit 6 to the lower position. Further, the chuck pin driving unit 25 moves the chuck pins 20 to the opening position. After that, with reference to FIG. 1 as well, the transfer robot CR enters the processing unit 2, scoops up the processed substrate W from the spin chuck 5, and carries it out of the processing unit 2 (substrate carry-out step). The substrate W is handed from the transfer robot CR to the transfer robot IR, and stored in the carrier CA by the transfer robot IR.

In the low surface tension liquid processing shown in FIGS. 12A to 12D, supply of the low surface tension liquid from the fluid nozzle 12 is started in a state where the parallel gas flow 100 is formed. However, the gas is not necessarily discharged from the first side gas discharge port 72A and the second side gas discharge port 72B prior to the supply of the low surface tension liquid. That is, the discharge of the low surface tension liquid may be started before the discharge of the gas, or the discharge of the gas from the first side gas discharge port 72A and the second side gas discharge port 72B may be started after the discharge of the low surface tension liquid is finished, that is, after the puddle state is formed.

By using the fluid nozzle 12 according to the first preferred embodiment, as described above, it is possible to discharge the gas from the first side gas discharge port 72A and improve the uniformity of the spread of the gas (parallel gas flow 100) from the center C side of the upper surface of the substrate W to the peripheral edge side. As a result, it is possible to favorably protect the upper surface of the substrate W by the gas discharged radially from the first side gas discharge port 72A.

When air enters the corresponding gas flow passages 76 from the side gas discharge ports 72, oxygen and water vapor may be sometimes mixed into the gas discharged from the side gas discharge ports 72. By mixture of oxygen and water vapor into the gas discharged from the side gas discharge ports 72, the oxygen concentration and moisture in the atmosphere in the vicinity of the upper surface of the substrate W may increase.

In the fluid nozzle 12 according to the first preferred embodiment, the second side gas discharge port 72B is also provided at the position further away from the substrate W than the first side gas discharge port 72A. Therefore, it is possible to discharge the gas from the second side gas discharge port 72B as well as the first side gas discharge port 72A and improve the uniformity of the spread of the gas (parallel gas flow 100) from the center C side of the upper surface of the substrate W to the peripheral edge side.

Since the second side gas discharge port 72B is provided, ingress of air into the first side gas discharge port 72A which is relatively near the upper surface of the substrate W is suppressed by the gas discharged from the second side gas discharge port 72B which is relatively far from the upper surface of the substrate W. Meanwhile, since no more side gas discharge port 72 is provided at a position further away from the upper surface of the substrate W than the second side gas discharge port 72B, there is no flow of a gas that suppresses ingress of air into the second side gas discharge port 72B. Thus, by making the width W2 of the second side gas discharge port 72B in the intersecting direction D1 narrower than the width W1 of the first side gas discharge port 72A in the intersecting direction D1, it is possible to suppress the ingress of air into the second side gas discharge port 72B. Thereby, it is possible to suppress an increase in oxygen concentration and moisture in the atmosphere in the vicinity of the upper surface of the substrate W.

As a result, it is possible to suppress oxygen from being dissolved in the low surface tension liquid on the substrate W and water from being mixed into the low surface tension liquid on the substrate W. By the mixture of water into the low surface tension liquid, the surface tension acting on the circuit pattern is increased. Therefore, it is possible to suppress unintended oxidation of the circuit pattern formed on the upper surface of the substrate W, and collapse of the circuit pattern.

As described above, the center gas discharge port 71 is placed in the truncated-cone-shaped recessed portion 75c. Thus, the gas discharged from the center gas discharge port 71 is easily spread uniformly radially. Therefore, it is possible to evenly spread the liquid film 110 to the peripheral edge of the substrate W. Therefore, it is possible to favorably remove the low surface tension liquid (processing liquid) from the upper surface of the substrate W.

Figure 13:
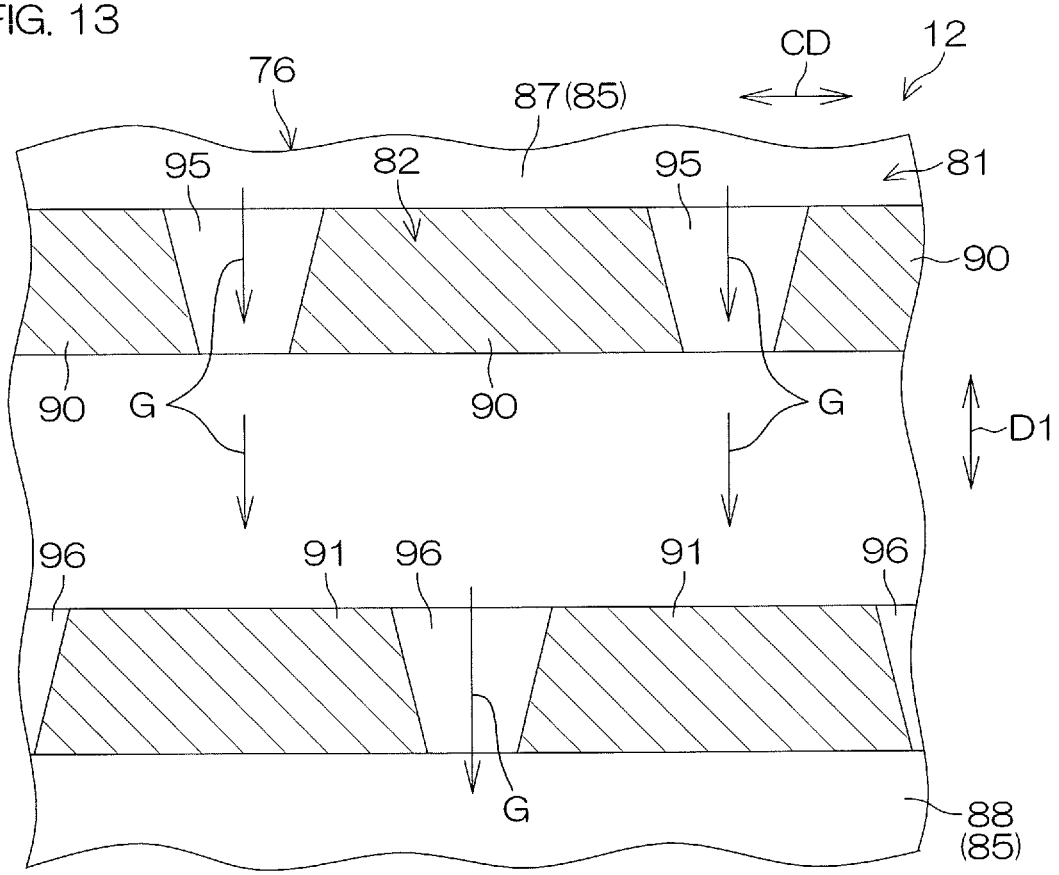
FIG. 13 is a cross-sectional view for describing a first modified example of a rectifying structure according to the first preferred embodiment.

Next, with reference to FIGS. 13 to 17, first to fourth modified examples of the rectifying structure 82 of the fluid nozzle 12 according to the first preferred embodiment will be described. For example, as shown in FIG. 13, the width of the first rectifying flow passages 95 in the circumferential direction CD may be gradually narrowed down to the downstream side in the flow passage direction (lower side in the intersecting direction D1). Similarly, the width of the second rectifying flow passages 96 in the circumferential direction CD may be gradually narrowed down to the downstream side in the flow passage direction (lower side in the intersecting direction D1).

Figure 14:
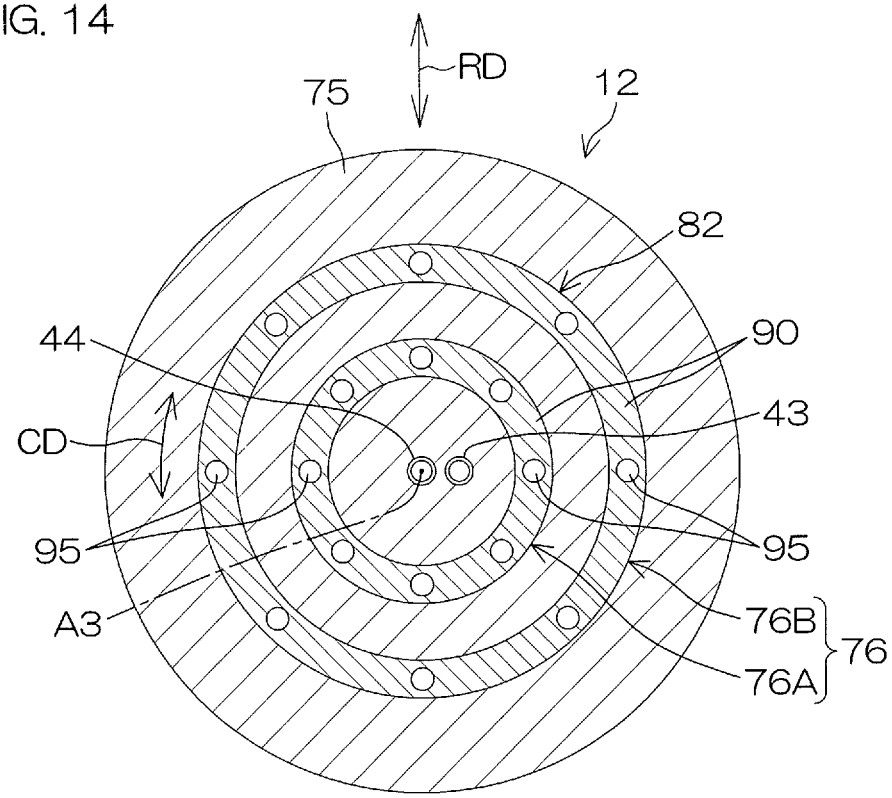
FIG. 14 is a schematic view for describing a second modified example of the rectifying structure according to the first preferred embodiment.
Figure 15:
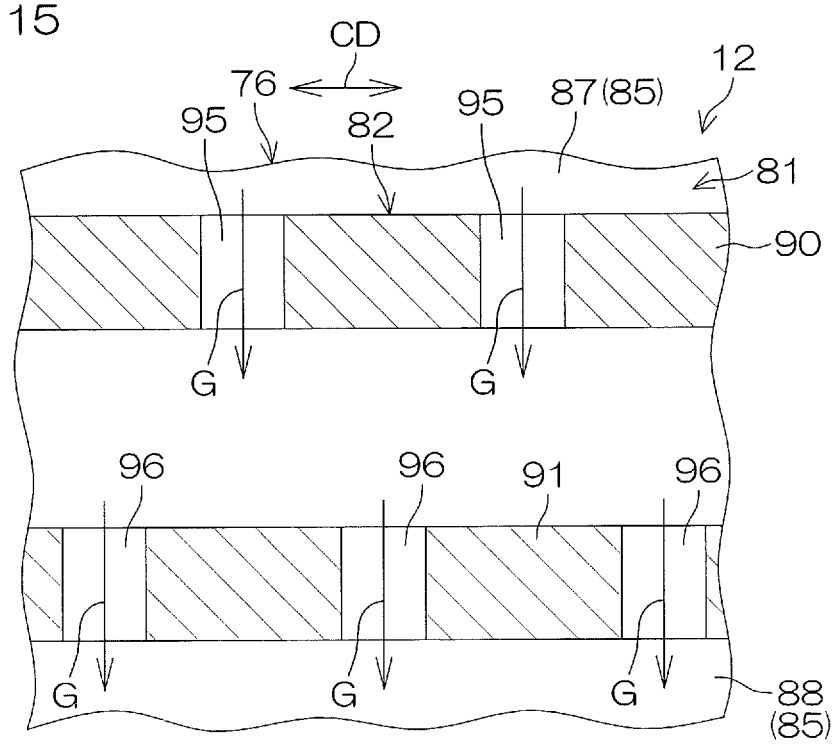
FIG. 15 is a cross-sectional view taken along line XV-XV shown in FIG. 14.

As shown in FIGS. 14 and 15, each of the first rectifying flow passages 95 may have a cylindrical shape along the flow passage direction (intersecting direction D1), and each of the second rectifying flow passages 96 may have a cylindrical shape along the flow passage direction (intersecting direction D1). In this case, circumferential end portions of the adjacent first shielding portions 90 are coupled, and the plurality of first shielding portions 90 as a whole form a shielding plate in which a plurality of through holes (first rectifying flow passages 95) are formed. Although not shown in the figures, circumferential end portions of the adjacent second shielding portions 91 are coupled, and the plurality of second shielding portions 91 as a whole form a shielding plate in which a plurality of through holes (second rectifying flow passages 96) are formed.

Figure 16:
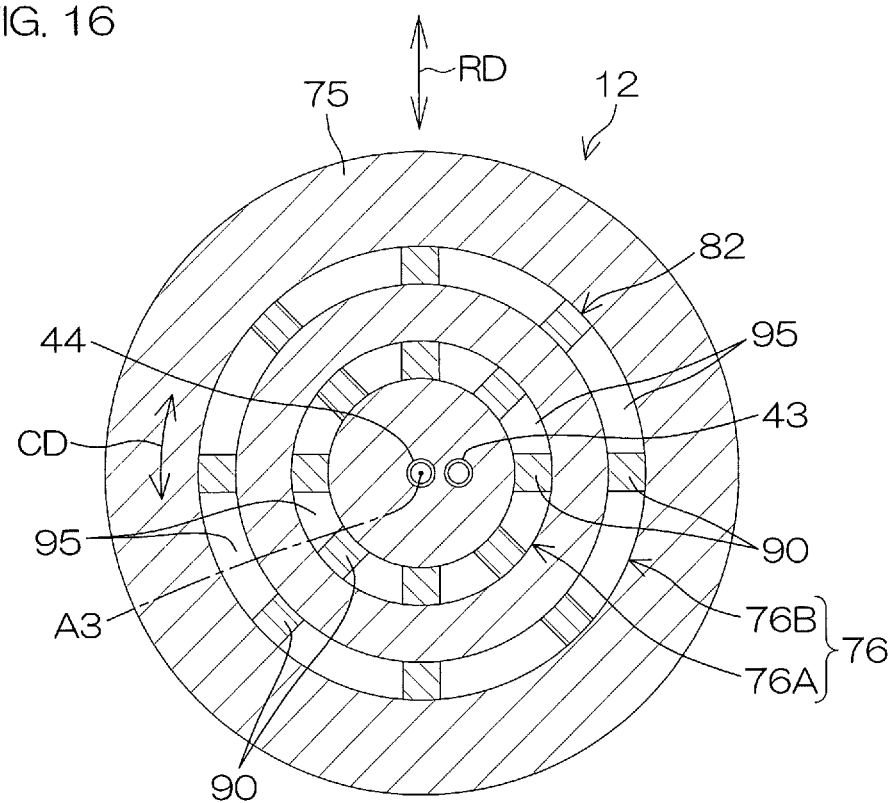
FIG. 16 is a schematic view for describing a third modified example of the rectifying structure according to the first preferred embodiment.
Figure 17:
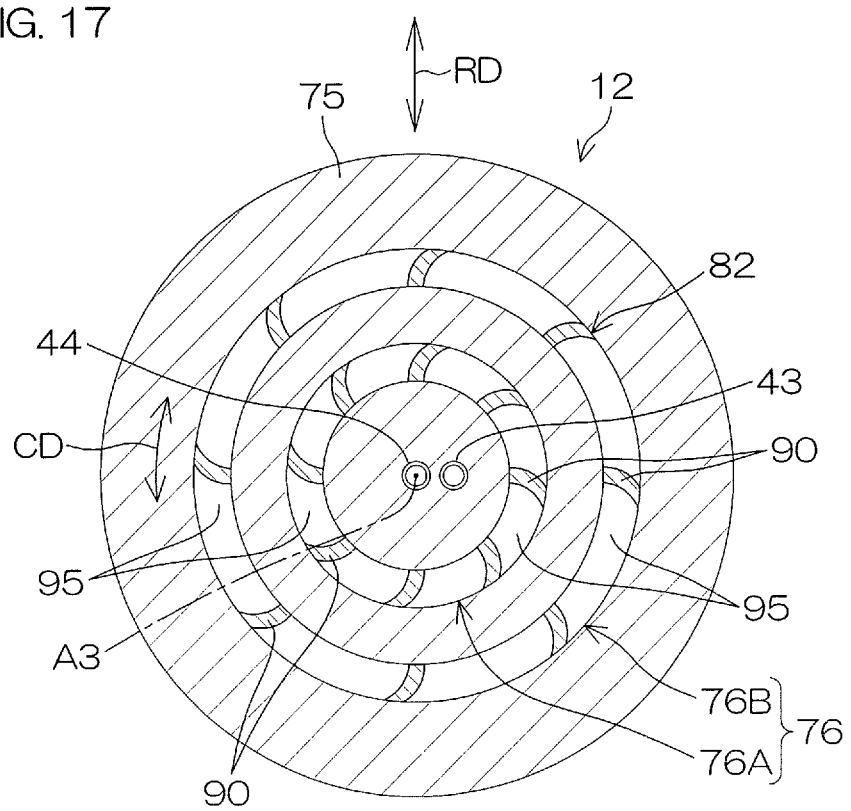
FIG. 17 a schematic view for describing a fourth modified example of the rectifying structure according to the first preferred embodiment.

As shown in FIG. 16, each of the first shielding portions 90 may have a linear blade shape linearly extending in the radial direction RD. As shown in FIG. 17, each of the first shielding portions 90 may have a curved blade shape curved so that an end on the outer side in the radial direction RD is placed on one side in the circumferential direction CD with respect to an end on the inner side. Each of the second shielding portions 91 may have a blade shape, like the first shielding portions 90.

Second Preferred Embodiment

Figure 18:
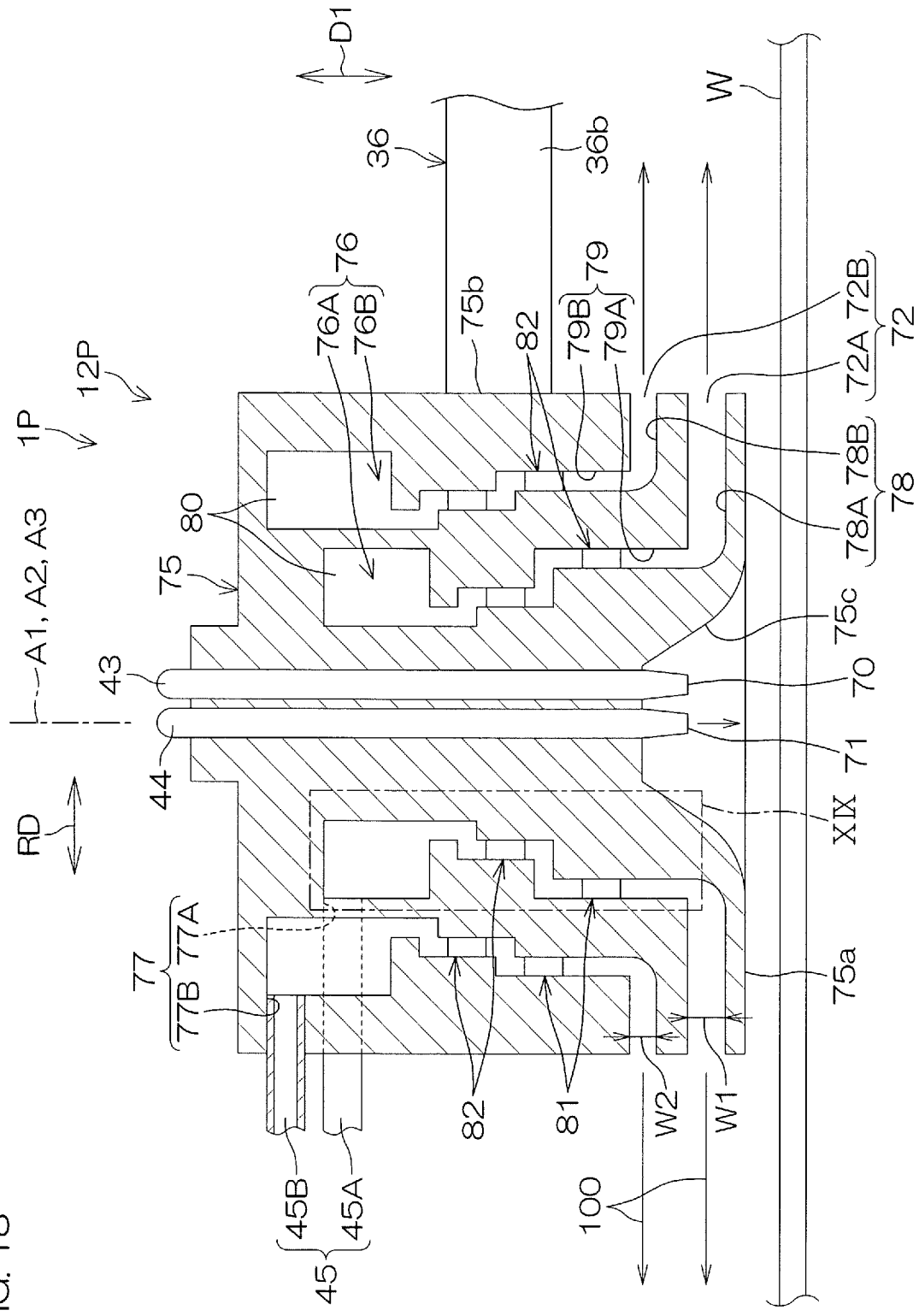
FIG. 18 is a cross-sectional view of a fluid nozzle provided in a substrate processing apparatus according to a second preferred embodiment.
Figure 19:
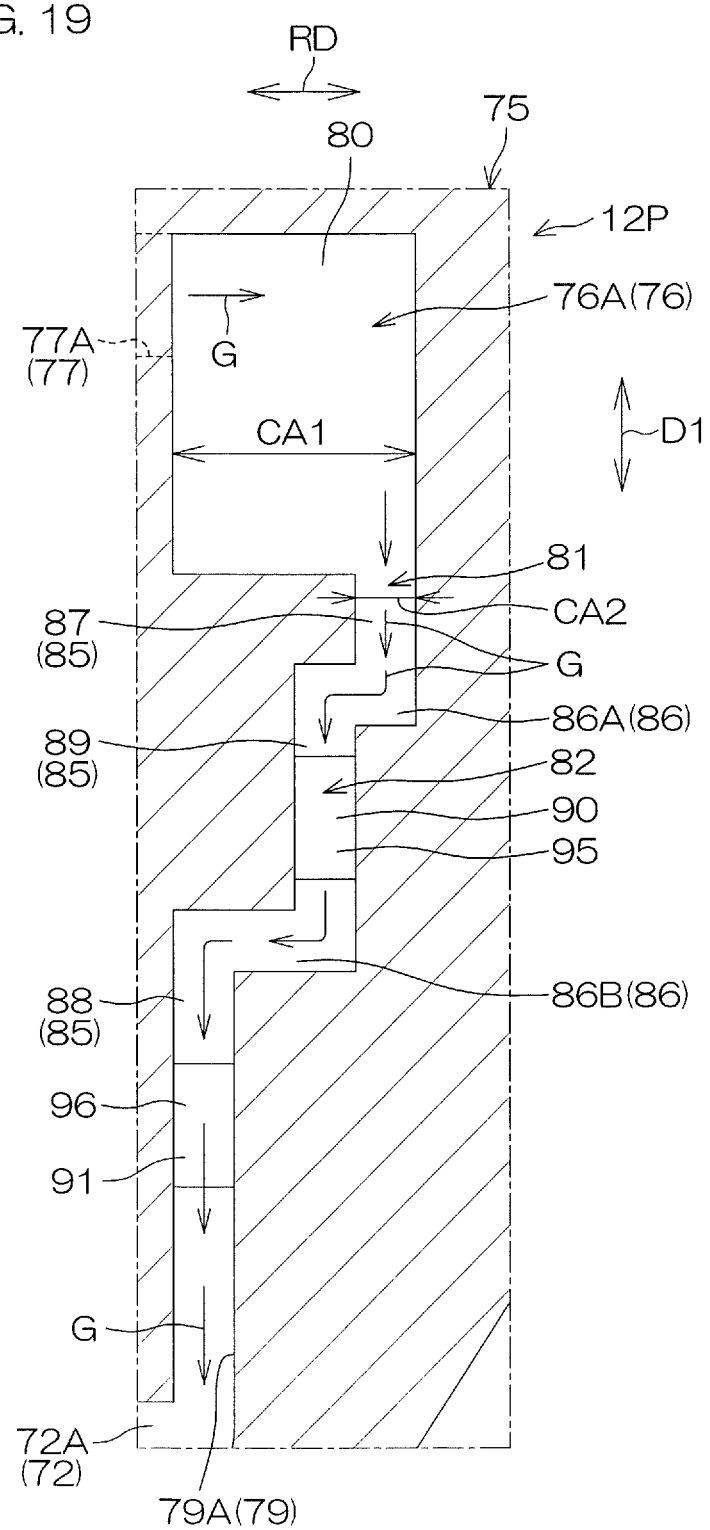
FIG. 19 is an enlarged view of an XIX region shown in FIG. 18.

FIG. 18 is a schematic cross-sectional view for describing a configuration example of a fluid nozzle 12P provided in a processing unit 2 of a substrate processing apparatus 1P according to a second preferred embodiment. FIG. 19 is an enlarged view of an XIX region shown in FIG. 18. In FIGS. 18 and 19, configurations which are equal to the configurations shown in FIGS. 1 to 17 described above will be provided with the same reference symbols as FIG. 1, etc., and description thereof will be omitted.

The substrate processing apparatus 1P according to the second preferred embodiment has the same configurations as the substrate processing apparatus 1 according to the first preferred embodiment except for the fluid nozzle 12P. The fluid nozzle 12P according to the second preferred embodiment is mainly different from the fluid nozzle 12 according to the first preferred embodiment in a point that a narrow flow passage 81 includes a plurality of bending flow passages 86 (see FIG. 19). The narrow flow passage 81 of the fluid nozzle 12P includes a linear flow passage 85 that connects a downstream end of a gas retaining portion 80 and an upstream end of a corresponding side gas discharge port 72, and the plurality of bending flow passages 86 (including a first bending flow passage 86A and a second bending flow passage 86B) that bend intermediate portions of the linear flow passage 85. Each of the bending flow passages 86 has a ring shape in a plan view spreading in the horizontal direction.

The linear flow passage 85 includes an upstream linear flow passage 87 connected to the downstream end of the gas retaining portion 80 and an upstream end of the first bending flow passage 86A, the upstream linear flow passage 87 linearly extending in the intersecting direction D1, a midstream linear flow passage 89 connected to a downstream end of the first bending flow passage 86A and an upstream end of the second bending flow passage 86B, the mid-stream linear flow passage 89 linearly extending in the intersecting direction D1, and a downstream linear flow passage 88 connected to a downstream end of the second bending flow passage 86B and the corresponding side gas discharge port 72, the downstream linear flow passage 88e linearly extending in the intersecting direction D1. Each of the upstream linear flow passage 87, the mid-stream linear flow passage 89, and the downstream linear flow passage 88 has a cylindrical shape extending in the intersecting direction D1.

In the second preferred embodiment, a plurality of first shielding portions 90 of a rectifying structure 82 are provided in the mid-stream linear flow passage 89, and a plurality of second shielding portions 91 are provided in the downstream linear flow passage 88.

According to the second preferred embodiment, the same effects as the first preferred embodiment are exerted. According to the second preferred embodiment, the plurality of bending flow passages 86 are further provided. Therefore, in comparison with the configuration that the single bending flow passage 86 is provided, flow speed of a gas is reduced, and it is possible to further reduce a flow speed difference of the gas in the circumferential direction CD. Thus, it is possible to improve uniformity of the spread of the gas which is discharged from the corresponding side gas discharge port 72 from the center C side of an upper surface of a substrate W to the peripheral edge side.

Third Embodiment

Figure 20:
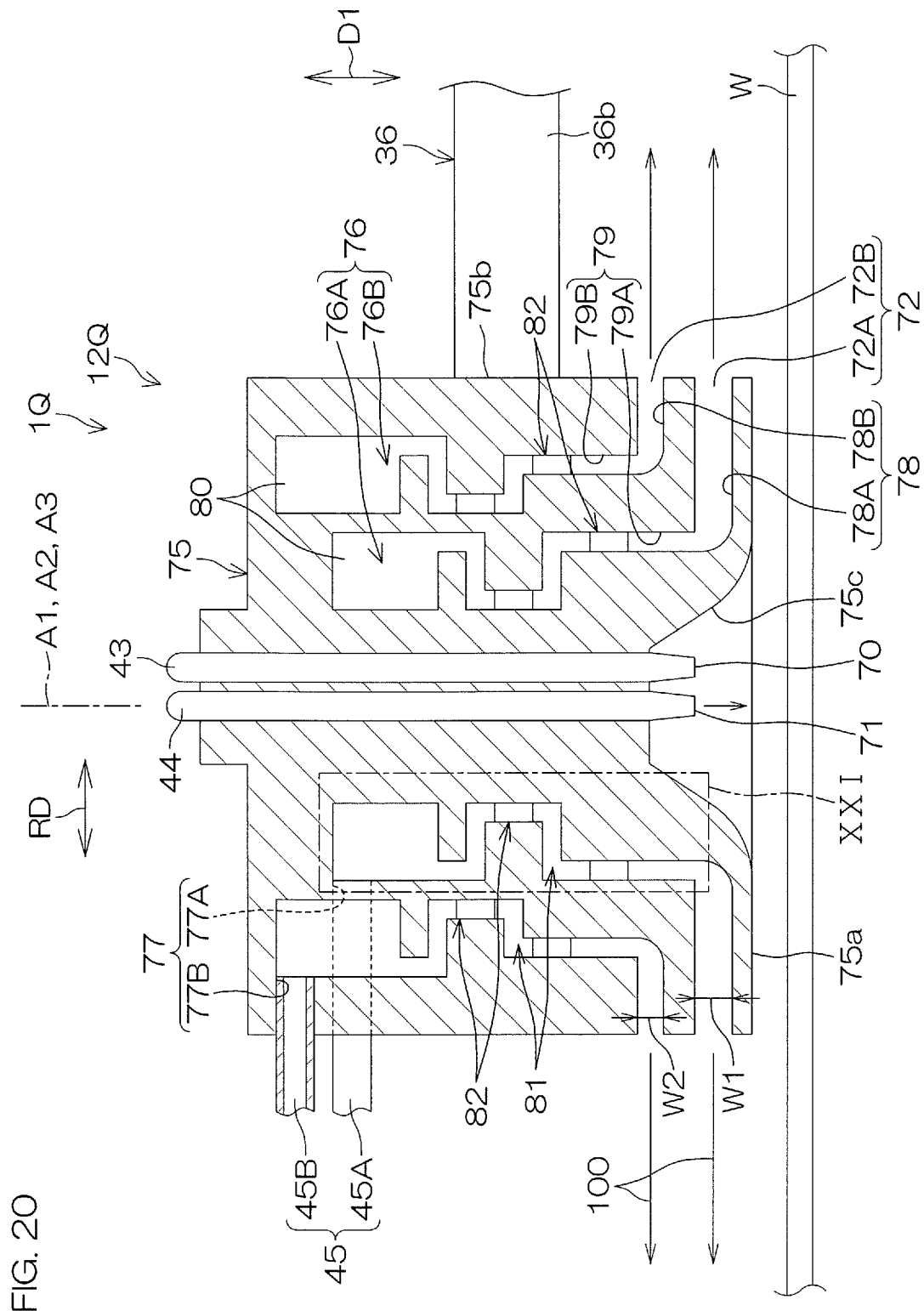
FIG. 20 is a cross-sectional view of a fluid nozzle provided in a substrate processing apparatus according to a third preferred embodiment.
Figure 21:
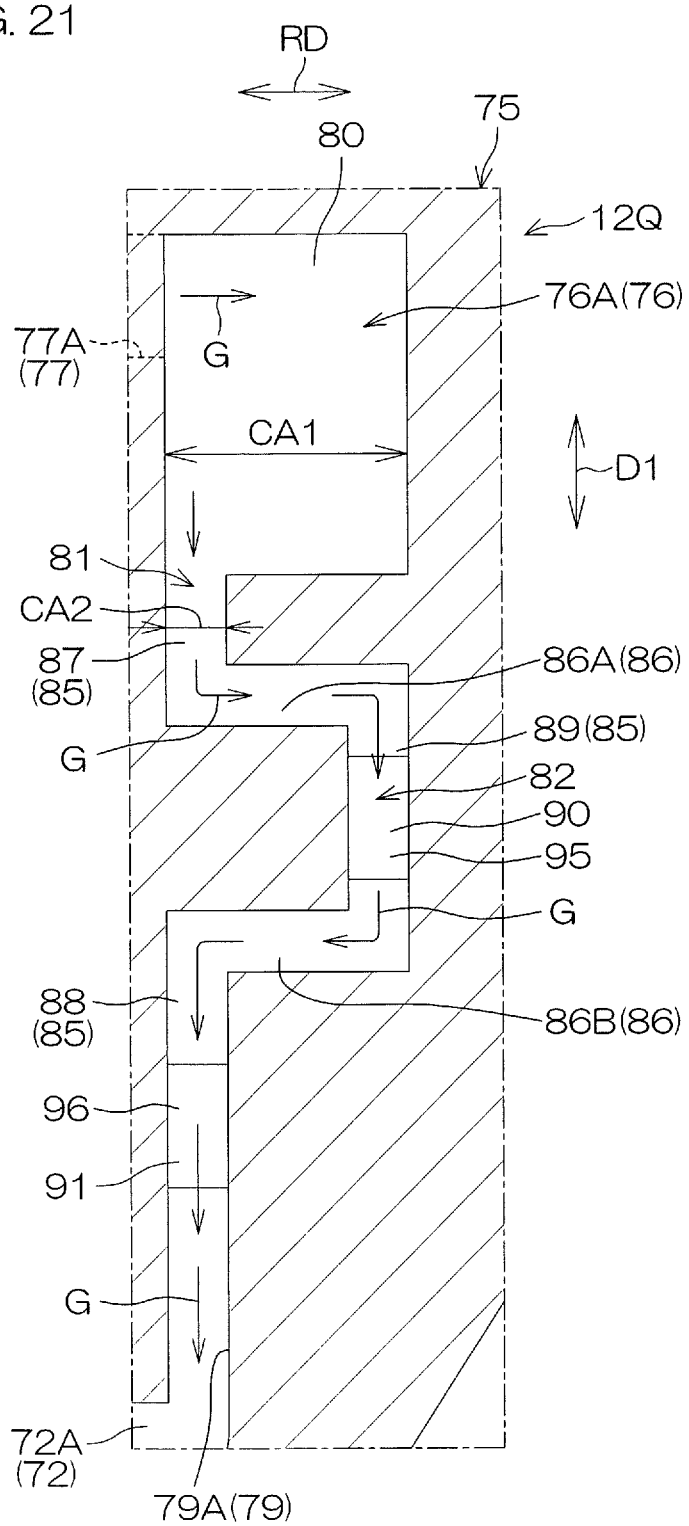
FIG. 21 is an enlarged view of an XXI region shown in FIG. 20.

FIG. 20 is a schematic cross-sectional view for describing a configuration example of a fluid nozzle 12Q provided in a processing unit 2 of a substrate processing apparatus 1Q according to a third preferred embodiment. FIG. 21 is an enlarged view of an XXI region shown in FIG. 20. In FIGS. 20 and 21, configurations which are equal to the configurations shown in FIGS. 1 to 19 described above will be provided with the same reference symbols as FIG. 1, etc., and description thereof will be omitted.

The substrate processing apparatus 1Q according to the third preferred embodiment has the same configurations as the substrate processing apparatus 1 according to the first preferred embodiment except for the fluid nozzle 12Q. The fluid nozzle 12Q according to the third preferred embodiment is mainly different from the fluid nozzle 12P according to the second preferred embodiment in a point that a narrow flow passage 81 is connected at a position which is close to a radially outer end rather than a radially inner end of a gas retaining portion 80. In the fluid nozzle 12Q, a plurality of bending flow passages 86 are provided as in the fluid nozzle 12P of the second preferred embodiment. However, unlike the fluid nozzle 12P of the second preferred embodiment, a mid-stream linear flow passage 89 is placed on the radially inner side of an upstream linear flow passage 87 and a downstream linear flow passage 88.

According to the third preferred embodiment, the same effects as the second preferred embodiment are exerted.

Fourth Embodiment

Figure 22:
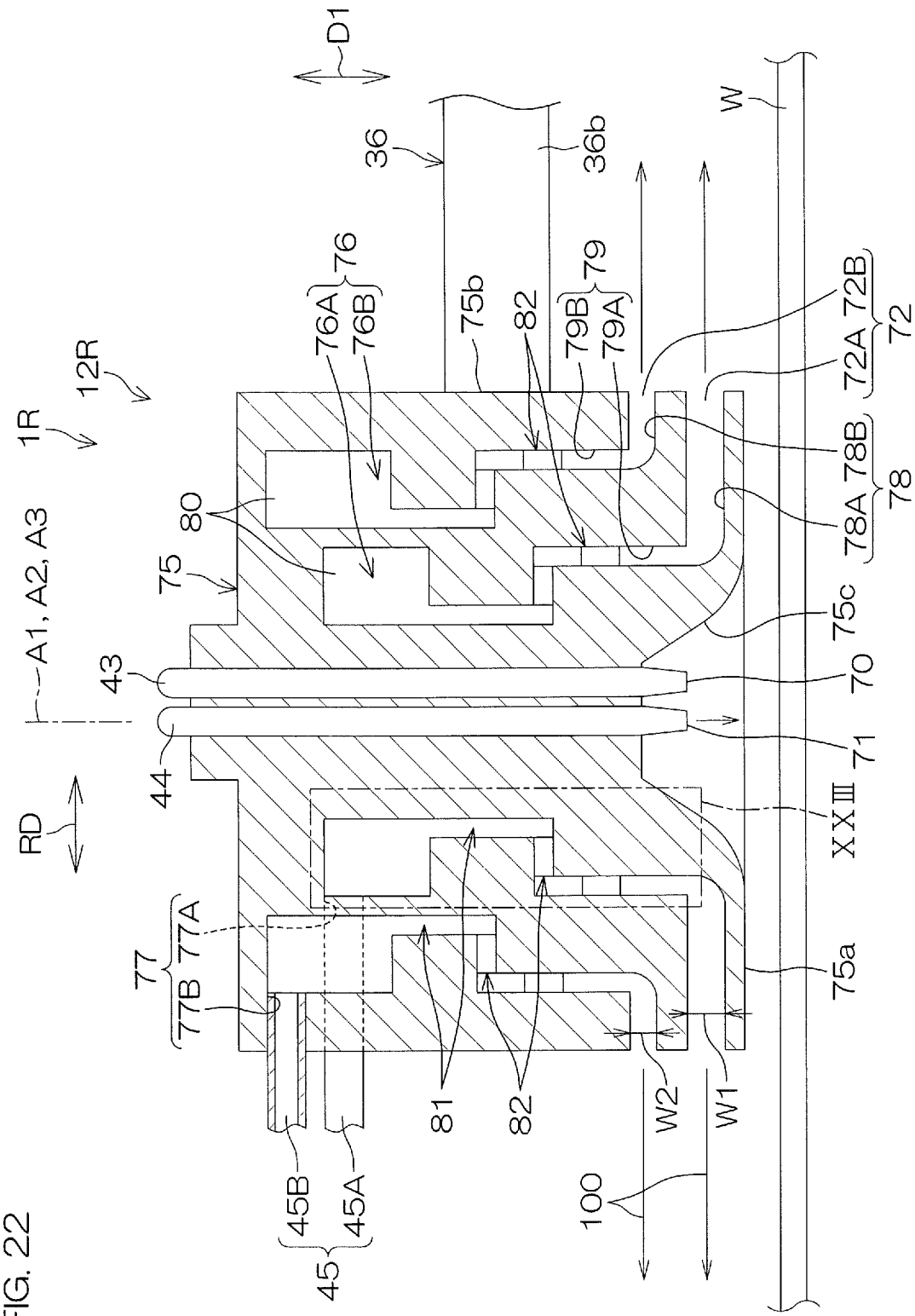
FIG. 22 is a cross-sectional view of a fluid nozzle provided in a substrate processing apparatus according to a fourth preferred embodiment.
Figure 23:
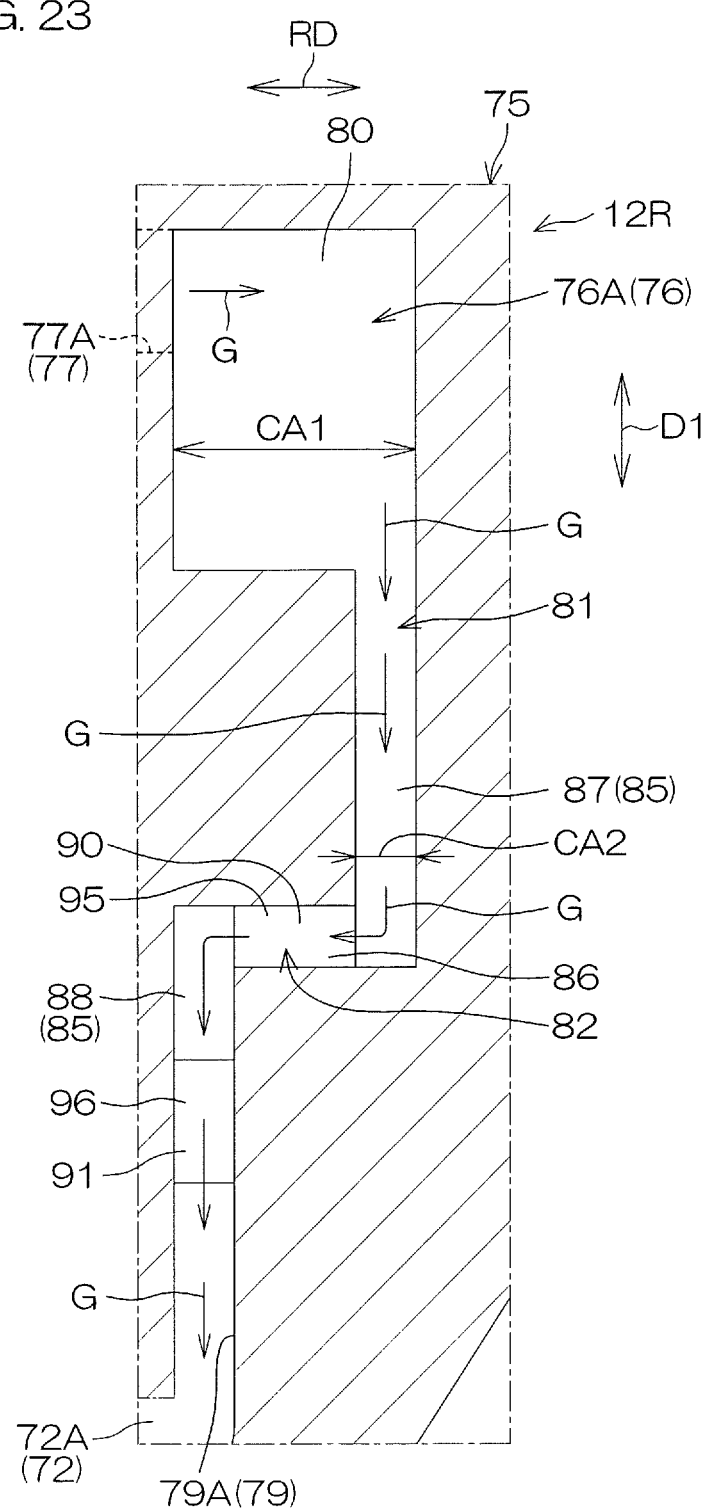
FIG. 23 is an enlarged view of an XXIII region shown in FIG. 22.

FIG. 22 is a schematic cross-sectional view for describing a configuration example of a fluid nozzle 12R provided in a processing unit 2 of a substrate processing apparatus 1R according to a fourth preferred embodiment. FIG. 23 is an enlarged view of an XXIIII region shown in FIG. 22. In FIGS. 22 and 23, configurations which are equal to the configurations shown in FIGS. 1 to 21 described above will be provided with the same reference symbols as FIG. 1, etc., and description thereof will be omitted.

The substrate processing apparatus 1R according to the fourth preferred embodiment has the same configurations as the substrate processing apparatus 1 according to the first preferred embodiment except for the fluid nozzle 12R. The fluid nozzle 12R according to the fourth preferred embodiment is mainly different from the fluid nozzle 12 according to the first preferred embodiment in a point that a rectifying structure 82 is provided in a bending flow passage 86. In detail, a plurality of first shielding portions 90 forming part of the rectifying structure 82 are provided in the bending flow passage 86. Therefore, a plurality of first rectifying flow passages 95 is also provided in an intermediate portion of the bending flow passage 86 as a matter of course.

Other Preferred Embodiments

The present invention is not limited to the aforementioned preferred embodiments but can be carried out in still other preferred embodiments.

For example, the modified examples of the first preferred embodiment (FIGS. 13 to 17) can also be applied to the second to fourth preferred embodiments. The preferred embodiments can also be combined with each other. For example, in the fluid nozzle 12P of the second preferred embodiment or the fluid nozzle 12Q of the third preferred embodiment, the rectifying structure 82 may be provided in the bending flow passage 86 as in the fourth preferred embodiment. With the fluid nozzle 12P or the fluid nozzle 12Q, the plurality of first shielding portions 90 and the plurality of second shielding portions 91 can be respectively provided in the plurality of bending flow passages 86.

In the preferred embodiments described above, the nozzle main body 75 is constituted of a single member, and the gas flow passages 76 are formed inside the nozzle main body 75. However, unlike the preferred embodiments described above, the nozzle main body 75 may be constituted by a plurality of members. Specifically, the nozzle main body 75 may include a plurality of flow passage partition members each of which has a surface partitioning the gas flow passages 76. By doing so, in comparison with the configuration that the gas flow passages 76 are formed inside a single member, the gas flow passages 76 are more easily formed.

In the preferred embodiments described above, the substrate processing apparatus 1 includes the transfer robots IR, CR, the plurality of processing units 2, and the controller 3. However, each of the substrate processing apparatuses 1, 1P may be constituted by a single processing unit 2 and a controller 3 and does not necessarily include the transfer robots IR, CR. Alternatively, the substrate processing apparatus 1 may be constituted only by a single processing unit 2. In other words, the processing unit 2 may be an example of the substrate processing apparatus.

In the preferred embodiments described above, each of the fluid nozzles 12, 12P, 12Q, 12R faces the upper surface of the substrate W. However, unlike the preferred embodiments described above, the fluid nozzles 12, 12P, 12Q, 12R may be configured to face the lower surface of the substrate W.

In the preferred embodiments described above, the linear flow passage 85 of the narrow flow passage 81 extends in the vertical direction. However, the linear flow passage 85 does not necessarily extend in the vertical direction, but the direction in which the linear flow passage 85 extends may be a direction inclined with respect to the vertical direction as long as the direction is a direction that intersects the circumferential direction CD (direction that intersects the upper surface of the substrate W).

In the preferred embodiments described above, as shown in FIG. 6, the circumferential phases of the plurality of first rectifying flow passages 95 of the first gas flow passage 76A substantially overlap the circumferential phases of the plurality of first rectifying flow passages 95 of the second gas flow passage 76B. As shown in FIG. 7, the circumferential phases of the second rectifying flow passages 96 of the first gas flow passage 76A substantially overlap the circumferential phases of the second rectifying flow passages 96 of the second gas flow passage 76B. However, unlike the example shown in FIGS. 6 and 7, the circumferential phases of the first rectifying flow passages 95 of the first gas flow passage 76A may be different from the circumferential phases of the first rectifying flow passages 95 of the second gas flow passage 76B, and the circumferential phases of the second rectifying flow passages 96 of the first gas flow passage 76A may be different from the circumferential phases of the second rectifying flow passages 96 of the second gas flow passage 76B.

In the preferred embodiments described above, as shown in FIG. 8, the circumferential phases of the plurality of first rectifying flow passages 95 are different from the circumferential phases of the plurality of second rectifying flow passages 96 in each of the gas flow passages 76. However, unlike the example shown in FIG. 8, the circumferential phases of the plurality of first rectifying flow passages 95 may overlap the circumferential phases of the plurality of second rectifying flow passages 96.

In the preferred embodiments described above, as shown in FIG. 4, the width W2 of the second side gas discharge port 72B is narrower than the width W1 of the first side gas discharge port 72A. However, unlike the example shown in FIG. 4, the width W2 of the second side gas discharge port 72B may be wider than the width W1 of the first side gas discharge port 72A as shown in FIG. 24.

When the flow rate of the gas discharged from the center gas discharge port 71 is relatively low (for example, when its 5 L/min or more and 15 L/min or less), an atmospheric pressure in the vicinity of the upper surface of the substrate W is easily lowered. When the atmospheric pressure in the vicinity of the upper surface of the substrate W is relatively low, the gas discharged from the first side gas discharge port 72A which is relatively near the upper surface of the substrate W is drawn to the upper surface side of the substrate W, and the uniformity of the spread of the gas discharged from the first side gas discharge port 72A may be lowered.

Thus, when the linear speed of the gas discharged from the first side gas discharge port 72A is increased by making the width W1 of the first side gas discharge port 72A narrower than the width W2 of the second side gas discharge port 72B, it is possible to suppress the gas discharged from the first side gas discharge port 72A from being drawn to the upper surface of the substrate W. Thereby, it is possible to improve uniformity of the gas which is discharged from the first side gas discharge port 72A. Eventually, it is possible to improve the uniformity of the spread of the gas which is discharged from the plurality of side gas discharge ports 72 from the center side of the upper surface of the substrate W to the peripheral edge side.

When the flow rate of the gas discharged from the center gas discharge port 71 is relatively high (for example, when it is about 50 L/min), as in the preferred embodiments described above, the configuration that the width W2 of the second side gas discharge port 72B is narrower than the width W1 of the first side gas discharge port 72A is preferred.

The configuration shown in FIG. 24, that is, the configuration that the width W2 of the second side gas discharge port 72B is wider than the width W1 of the first side gas discharge port 72A can be applied to the preferred embodiments described above. Unlike FIGS. 4 and 24, the width W2 of the second side gas discharge port 72B may be the same as the width W1 of the first side gas discharge port 72A.

In each of the substrate processing apparatuses 1, 1P, 1Q, 1R described above, the heater unit 6 is provided. However, the heater unit 6 is not necessarily provided but the substrate W can also be heated by a means other than the heater unit 6. A means that heats the substrate W may not necessarily be provided at all.

In the low surface tension liquid processing in the substrate processing described above (see FIGS. 12A to 12C), the substrate W is heated by the heater unit 6 and the low surface tension liquid is removed from the upper side of the substrate W in a state where the gas phase layer is formed between the liquid film 110 and the substrate W. However, the low surface tension liquid processing may be a processing for removing the liquid film 110 from the upper side of the substrate W without forming the gas phase layer. The fluid nozzle 12 can also be applied to a low surface tension liquid processing for removing the low surface tension liquid from the upper side of the substrate W by at least any of convection action generated in the liquid film 110 by heating, blowing force of the gas, and centrifugal force of the rotation of the substrate W without forming the gas phase layer.

In each of the fluid nozzles 12, 12P, 12Q, 12R, a single gas discharge port (first side gas discharge port 72A) may be provided and the second side gas discharge port 72B may not be necessarily provided. In that case, a single gas flow passage 76 is provided in the nozzle main body 75 of the fluid nozzle 12.

The expressions such as "along," "horizontal," "orthogonal," and "vertical" are used in the preferred embodiments described above. However, there is no need for strict use of "along," "horizontal," "orthogonal," and "vertical." That is, each of these expressions allows for deviations in manufacturing accuracy, installment accuracy, etc.

From the description and the attached drawings, the following features can be extracted in addition to the features described in the Claims. These features can be arbitrarily combined with the features described in the paragraphs of the means for solving the problems.

(Addition 1-1)

A fluid nozzle including
  a nozzle main body having a bottom surface and a side surface which is coupled to the bottom surface,
  a tubular gas flow passage formed inside the nozzle main body, and
  an annular gas discharge port which is opened from the side surface of the nozzle main body, the gas discharge port from which a gas is discharged radially toward the outside of the side surface, wherein
    the gas flow passage has a gas retaining portion whose flow passage cross-sectional area is larger than other portions of the gas flow passage, and a rectifying structure provided in a portion of the gas flow passage different from the gas retaining portion, the rectifying structure that rectifies a flow of the gas in the gas flow passage.

According to Addition 1-1, since the gas retaining portion whose flow passage cross-sectional area is larger than other portions of the gas flow passage is provided in the gas flow passage, the gas supplied to the gas retaining portion is dispersed in the gas retaining portion. Therefore, flow speed of the gas supplied into the gas retaining portion is reduced, and a flow speed difference of the gas between the positions in the circumferential direction of the gas flow passage is reduced. Further, the gas in the gas flow passage is rectified by the rectifying structure provided in the portion of the gas flow passage different from the gas retaining portion. Thereby, the moving direction of the gas in the gas flow passage is adjusted to the direction along the gas flow passage. Therefore, it is possible to improve uniformity of radial spread of the gas which is discharged from the gas discharge port. Thus, it is possible to protect a principal surface of a substrate, for example, by making the bottom surface of the nozzle main body face the principal surface of the substrate and discharging the gas from the gas discharge port.

(Addition 1-2)

The fluid nozzle according to Addition 1-1, including a plurality of the gas discharge ports, and a plurality of the gas flow passages through which the gas is guided respectively to the plurality of gas discharge ports, wherein
    the plurality of gas discharge ports has an annular first gas discharge port, and an annular second gas discharge port provided at a position further away from the bottom surface than the first gas discharge port.

According to Addition 1-2, in addition to the first gas discharge port, the gas is also discharged from the second gas discharge port provided at the position further away from the bottom surface of the nozzle main body than the first gas discharge port. Thus, it is possible to thicken a layer of the gas which spreads radially.

(Addition 1-3)

The fluid nozzle according Addition 1-2, wherein a width of the second gas discharge port is narrower than a width of the first gas discharge port.

Since one more gas discharge port (second gas discharge port) is provided at the position further away from the bottom surface of the nozzle main body than the gas discharge port (first gas discharge port), ingress of air into the gas discharge port (first gas discharge port) which is relatively close to the bottom surface of the nozzle main body is suppressed by the gas discharged from the gas discharge port (second gas discharge port) which is relatively far from the bottom surface of the nozzle main body. Meanwhile, since no further gas discharge port is provided at a position further away from the bottom surface of the nozzle main body than the second gas discharge port, there is no flow of a gas that suppresses ingress of air into the second gas discharge port. Thus, by making the width of the annular second gas discharge port narrower than the width of the annular first gas discharge port, it is possible to suppress the ingress of air into the second gas discharge port. Therefore, for example, when the bottom surface of the nozzle main body faces the principal surface of the substrate, it is possible to suppress an increase in oxygen concentration in the atmosphere in the vicinity of the principal surface of the substrate, and it is possible to more favorably protect the principal surface of the substrate.

(Addition 1-4)

The fluid nozzle according to Addition 1-2, wherein a width of the second gas discharge port is wider than a width of the first gas discharge port.

According to Addition 1-4, linear speed of the gas discharged from the first gas discharge port is increased. Therefore, for example, when the bottom surface of the nozzle main body faces the principal surface of the substrate, it is possible to suppress the gas discharged from the first gas discharge port from being drawn to the principal surface of the substrate. Thereby, it is possible to improve the uniformity of the spread of the gas which is discharged from the gas discharge port from the center side of the principal surface of the substrate to the peripheral edge side.

(Addition 1-5)

The fluid nozzle according to any of Addition 1-1 to Addition 1-4, wherein the rectifying structure has a plurality of first shielding portions provided at intervals in a circumferential direction of the gas flow passage, the first shielding portions shield movement of the gas to a downstream side of the gas flow passage.

According to Addition 1-5, the movement of the gas to the downstream side of the gas flow passage is shielded by the plurality of first shielding portions provided at intervals in the circumferential direction. Therefore, at the time of passing through between the two first shielding portions adjacent to each other in the circumferential direction, a circumferential component of the flow speed of the gas is reduced. Thereby, it is possible to bring the discharging direction of the gas discharged from the gas discharge port close to the radial direction of the gas flow passage. Thus, it is possible to further improve the uniformity of the spread of the gas which is discharged from the gas discharge port.

(Addition 1-6)

The fluid nozzle according to Addition 1-5, wherein the rectifying structure further has a plurality of second shielding portions provided on the downstream side of the plurality of first shielding portions in the gas flow passage, the second shielding portions shield movement of the gas to the downstream side of the gas flow passage, the positions of the plurality of second shielding portions in the circumferential direction are deviated from the positions of the plurality of first shielding portions in the circumferential direction.

The circumferential component of the flow speed of the gas passing through between the two first shielding portions adjacent to each other in the circumferential direction is reduced by the plurality of first shielding portions, whereas on the downstream side of the plurality of first shielding portions in the gas flow passage, the flow rate of the gas flowing through the same circumferential position as the first shielding portions is reduced. Thus, with the configuration that the circumferential position of the plurality of second shielding portions that shield the movement of the gas to the downstream side of the gas flow passage is deviated from the circumferential position of the plurality of first shielding portions on the downstream side of the plurality of first shielding portions in the gas flow passage, it is possible to reduce the flow rate of the gas flowing through the same circumferential position as the second shielding portions. Thereby, it is possible to improve uniformity of the flow rate of the gas at the positions in the circumferential direction. As a result, it is possible to further improve the uniformity of the spread of the gas which is discharged from the gas discharge port.

Further, it is possible to reduce a circumferential component of speed of the gas by the plurality of second shielding portions in addition to the plurality of first shielding portions. That is, it is possible to reduce the circumferential component of the speed of the gas in two stages. Thereby, it is possible to bring the discharging direction of the gas discharged from the gas discharge port closer to the radial direction of the gas flow passage.

(Addition 1-7)

The fluid nozzle according to any of Addition 1-1 to Addition 1-6, wherein the gas flow passage further has a linear flow passage linearly extending in an intersecting direction with respect to a circumferential direction of the gas flow passage, and a bending flow passage that bends an intermediate portion of the linear flow passage. According to Addition 1-7, by bending the intermediate portion of the linear flow passage, the flow speed of the gas is reduced and the flow speed difference of the gas between the positions in the circumferential direction of the gas flow passage is reduced.

(Addition 1-8)

The fluid nozzle according to any of Addition 1-1 to Addition 1-7, further including a center gas discharge port from which the gas is discharged toward a center of the principal surface of the substrate, wherein a truncated-cone-shaped recessed portion is formed on the bottom surface of the fluid nozzle, and the center gas discharge port is placed in the recessed portion.

According to Addition 1-8, the center gas discharge port is disposed in the truncated-cone-shaped recessed portion. Therefore, for example, when the bottom surface of the nozzle main body faces the principal surface of the substrate, by making the bottom surface of the nozzle main body face the principal surface of the substrate and discharging the gas from the gas discharge port, the gas supplied to the center of the principal surface of the substrate heads to the peripheral edge side of the substrate while spreading in the recessed portion. Since the recessed portion is formed in a truncated cone shape, it is possible to evenly spread the gas from the entire region of a peripheral edge of the recessed portion to the outside of the recessed portion. Thereby, it is possible to improve the uniformity of the spread of the gas discharged from the gas discharge port.

(Addition 1-9)

The fluid nozzle according to Addition 1-7, further including a processing liquid discharge port placed in the recessed portion, the processing liquid discharge port from which a processing liquid is discharged toward the principal surface of the substrate. Therefore, for example, when the bottom surface of the nozzle main body faces the principal surface of the substrate, by discharging the gas from the gas discharge port which is opened from the side surface of the fluid nozzle while discharging the processing liquid to the principal surface of the substrate from the processing liquid discharge port, it is possible to protect the processing liquid on the principal surface of the substrate from the outside atmosphere. For example, it is possible to suppress oxygen contained in the outside atmosphere from being dissolved in the processing liquid on the principal surface of the substrate.

Further, by discharging the gas from the center gas discharge port and pushing out the processing liquid to a peripheral edge of the substrate, it is possible to remove the processing liquid from the peripheral edge of the substrate. The gas discharged from the center gas discharge port is uniformly spread from the entire region of the peripheral edge of the recessed portion to the outside of the recessed portion. Thus, it is possible to favorably remove the processing liquid from the principal surface of the substrate.

(Addition 1-10)

The fluid nozzle according to any of Addition 1-1 to Addition 1-9, further including a gas inflow port from which the gas flows into the gas flow passage from a circumferential direction of the gas flow passage.

Therefore, the gas supplied to the gas flow passage from the circumferential direction of the gas flow passage is swirled in the circumferential direction in the gas flow passage. Since the rectifying structure is provided in the portion of the gas flow passage different from the gas retaining portion, the gas in the gas flow passage is rectified. Thereby, it is possible to improve the uniformity of the spread of the gas discharged from the gas discharge port.

Although the preferred embodiments of the present invention have been described in detail, these are merely specific examples used to clarify the technical content of the present invention, and the present invention should not be interpreted as being limited to these specific examples. The scope of the present invention shall be limited only by the appended claims.

What is claimed is:

1. A substrate processing apparatus comprising:
a spin chuck that holds a substrate; and
a fluid nozzle disposed to face a principal surface of the substrate which is held by the spin chuck, wherein
the fluid nozzle includes a gas discharge port from which a gas is discharged radially from the center side of the principal surface of the substrate to the peripheral edge side, and a gas flow passage through which the gas is supplied to the gas discharge port, the gas flow passage having a tubular shape along an intersecting direction with respect to the principal surface of the substrate, and
the gas flow passage has a gas retaining portion whose flow passage cross-sectional area is larger than other portions of the gas flow passage, and a rectifying structure provided in a portion of the gas flow passage different from the gas retaining portion, the rectifying structure that rectifies a flow of the gas in the gas flow passage, and
the rectifying structure has a plurality of first shielding portions provided at intervals along a circumferential direction of the gas flow passage, the first shielding portions shield movement of the gas to a downstream side of the gas flow passage, and
a downstream end of the first shielding portion is positioned on an upstream side of the gas discharge port.

2. The substrate processing apparatus according to claim 1, wherein
the fluid nozzle includes a plurality of the gas discharge ports, and a plurality of the gas flow passages through which the gas is supplied respectively to the plurality of gas discharge ports, and
the plurality of gas discharge ports has a first gas discharge port, and a second gas discharge port provided at a position further away from the principal surface of the substrate in the intersecting direction than the first gas discharge port.

3. The substrate processing apparatus according to claim 2, wherein
a width of the second gas discharge port in the intersecting direction is narrower than a width of the first gas discharge port in the intersecting direction.

4. The substrate processing apparatus according to claim 2, wherein
a width of the second gas discharge port in the intersecting direction is wider than a width of the first gas discharge port in the intersecting direction.

5. The substrate processing apparatus according to claim 1, wherein
the rectifying structure further has a plurality of second shielding portions provided on the downstream side of the plurality of first shielding portions in the gas flow passage, the second shielding portions shield movement of the gas to the downstream side of the gas flow passage, and
the positions of the plurality of second shielding portions in the circumferential direction are deviated from the positions of the plurality of first shielding portions in the circumferential direction.

6. The substrate processing apparatus according to claim 1, wherein
the gas flow passage further has a linear flow passage linearly extending in the intersecting direction, and a bending flow passage that bends an intermediate portion of the linear flow passage.

7. The substrate processing apparatus according to claim 6, wherein
the rectifying structure is provided in the bending flow passage.

8. The substrate processing apparatus according to claim 1, wherein
the fluid nozzle further includes a nozzle main body having a facing surface which faces the principal surface of the substrate and a side surface coupled to the facing surface, the side surface on which the gas discharge port is opened, the nozzle main body inside of which the gas flow passage is formed.

9. The substrate processing apparatus according to claim 8, wherein
the fluid nozzle further includes a center gas discharge port from which the gas is discharged toward a center of the principal surface of the substrate,
a truncated-cone-shaped recessed portion recessed in the direction away from the principal surface of the substrate is formed on the facing surface of the fluid nozzle, and
the center gas discharge port is placed in the recessed portion.

10. The substrate processing apparatus according to claim 9, wherein
the fluid nozzle further includes a processing liquid discharge port placed in the recessed portion, the processing liquid discharge port from which a processing liquid is discharged toward the principal surface of the substrate.

11. The substrate processing apparatus according to claim 8, wherein
the nozzle main body includes a plurality of flow passage partition members each of which has a surface partitioning the gas flow passage.

12. The substrate processing apparatus according to claim 1, further comprising:
a gas pipe connected to the fluid nozzle, the gas pipe through which the gas is supplied to the gas flow passage from a direction parallel to the principal surface of the substrate.

13. A substrate processing apparatus comprising: a spin chuck that holds a substrate; and a fluid nozzle disposed to face a principal surface of the substrate which is held by the spin chuck, wherein the fluid nozzle includes a gas discharge port from which a gas is discharged radially from the center side of the principal surface of the substrate to the peripheral edge side, and a gas flow passage through which the gas is supplied to the gas discharge port, the gas flow passage having a tubular shape along an intersecting direction with respect to the principal surface of the substrate, and the gas flow passage has a gas retaining portion whose flow passage cross-sectional area is larger than other portions of the gas flow passage, a downstream end and a rectifying structure provided in a portion of the gas flow passage different from the gas retaining portion, the rectifying structure that rectifies a flow of the gas in the gas flow passage, a downstream end of the first shielding portion is positioned on an upstream side of the gas discharge port, and the rectifying structure has a plurality of first shielding portions that is provided at intervals along a circumferential direction of the gas flow passage and that shield movement of the gas to a downstream side of the gas flow passage, and a plurality of second shielding portions that is provided on the downstream side of the plurality of first shielding portions in the gas flow passage and that shield movement of the gas to the downstream side of the gas flow passage, and the positions of the plurality of second shielding portions in the circumferential direction are deviated from the positions of the plurality of first shielding portions in the circumferential direction.

14. A substrate processing apparatus comprising:
a spin chuck that holds a substrate; and
a fluid nozzle disposed to face a principal surface of the substrate which is held by the spin chuck, wherein
the fluid nozzle includes a gas discharge port from which a gas is discharged radially from the center side of the principal surface of the substrate to the peripheral edge side, and a gas flow passage through which the gas is supplied to the gas discharge port, the gas flow passage having a tubular shape along an intersecting direction with respect to the principal surface of the substrate, and
the gas flow passage has a gas retaining portion whose flow passage cross-sectional area is larger than other portions of the gas flow passage, and a rectifying structure provided in a portion of the gas flow passage different from the gas retaining portion, the rectifying structure that rectifies a flow of the gas in the gas flow passage, and
the gas flow passage further has a linear flow passage linearly extending in the intersecting direction, and a bending flow passage that bends an intermediate portion of the linear flow passage, and
the linear flow passage includes an upstream linear flow passage and a downstream linear flow passage linearly extending in the intersecting direction, and
the bending flow passage connects the upstream linear flow passage and the downstream linear flow passage with each other and extends in a direction different from the intersecting direction.

* * * * *